US007575621B2

(12) United States Patent
Vanheusden et al.

(10) Patent No.: US 7,575,621 B2
(45) Date of Patent: Aug. 18, 2009

(54) SEPARATION OF METAL NANOPARTICLES

(75) Inventors: Karel Vanheusden, Placitas, NM (US); Hyungrak Kiim, Albuquerque, NM (US); Aaron D. Stump, Albuquerque, NM (US); Allen B. Schult, Albuquerque, NM (US); Mark J. Hampden-Smith, Albuquerque, NM (US); Chuck Edwards, Rio Rancho, NM (US); Anthony R. James, Rio Rancho, NM (US); James Caruso, Albuquerque, NM (US); Toivo T. Kodas, Albuquerque, NM (US); Scott Thomas Haubrich, Albuquerque, NM (US); Mark H. Kowalski, Albuquerque, NM (US)

(73) Assignee: Cabot Corporation, Boston, MA (US)

(*) Notice: Subject to any disclaimer, the term of this patent is extended or adjusted under 35 U.S.C. 154(b) by 372 days.

(21) Appl. No.: 11/331,238

(22) Filed: Jan. 13, 2006

(65) Prior Publication Data
US 2006/0159603 A1 Jul. 20, 2006

Related U.S. Application Data

(60) Provisional application No. 60/643,629, filed on Jan. 14, 2005, provisional application No. 60/643,578, filed on Jan. 14, 2005, provisional application No. 60/643,577, filed on Jan. 14, 2005.

(51) Int. Cl.
*B22F 9/24* (2006.01)
(52) U.S. Cl. .......................... 75/351; 75/371; 977/777; 977/896
(58) Field of Classification Search ........................ None
See application file for complete search history.

(56) References Cited

U.S. PATENT DOCUMENTS

| | | |
|---|---|---|
| 2,785,964 A | 3/1957 | Pollock |
| 3,313,632 A | 4/1967 | Langley et al. ................. 106/1 |
| 3,401,020 A | 9/1968 | Kester et al. |
| 3,683,382 A | 8/1972 | Ballinger ..................... 346/74 |
| 3,814,696 A | 6/1974 | Verdone et al. ............. 252/317 |
| 3,922,355 A | 11/1975 | Kotthoff |
| 3,922,388 A | 11/1975 | Schebalin |
| RE28,972 E | 9/1976 | Weber et al. |
| 4,019,188 A | 4/1977 | Hochberg et al. ............. 346/75 |
| 4,105,483 A | 8/1978 | Lin ............................ 156/154 |
| 4,122,062 A | 10/1978 | Monte et al. ............. 260/42.14 |
| 4,130,671 A | 12/1978 | Nagesh et al. ............ 427/125 |
| 4,170,480 A | 10/1979 | Ikenoue et al. ............. 96/114.1 |
| 4,186,244 A | 1/1980 | Deffeyes et al. ............ 428/570 |
| 4,211,668 A | 7/1980 | Tate ........................... 252/316 |
| 4,255,291 A | 3/1981 | Needes et al. ............... 252/578 |
| 4,266,229 A | 5/1981 | Mansukhani ............... 346/1.1 |
| 4,289,534 A | 9/1981 | Deffeyes et al. ........... 106/1.14 |
| 4,333,966 A | 6/1982 | Deffeyes et al. ............. 427/96 |
| 4,370,308 A | 1/1983 | Williams et al. |
| 4,381,945 A | 5/1983 | Nair .......................... 106/1.14 |
| 4,407,674 A | 10/1983 | Ehrreich ...................... 75/251 |
| 4,416,932 A | 11/1983 | Nair .......................... 428/209 |
| 4,418,099 A | 11/1983 | Cuevas et al. .............. 427/229 |
| 4,419,383 A | 12/1983 | Lee .............................. 427/47 |
| 4,463,030 A | 7/1984 | Deffeyes et al. ............ 427/216 |
| 4,487,811 A | 12/1984 | Eichelberger et al. ....... 428/546 |
| 4,508,753 A | 4/1985 | Stepan ...................... 427/53.1 |
| 4,517,252 A | 5/1985 | Hugh ......................... 428/553 |
| 4,539,041 A | 9/1985 | Figlarz et al. ................. 75/0.5 |
| 4,548,879 A | 10/1985 | St. John et al. ................ 427/96 |
| 4,599,277 A | 7/1986 | Brownlow et al. .......... 428/552 |
| 4,622,069 A | 11/1986 | Akai et al. ................. 106/1.11 |
| 4,627,875 A | 12/1986 | Kobayashi et al. ............ 106/22 |
| 4,650,108 A | 3/1987 | Gallagher ................... 228/124 |
| 4,668,533 A | 5/1987 | Miller ......................... 427/98 |
| 4,720,418 A | 1/1988 | Kuo |
| 4,753,821 A | 6/1988 | Giesecke et al. .............. 427/98 |
| 4,775,439 A | 10/1988 | Seeger, Jr. et al. .......... 156/231 |
| 4,808,274 A | 2/1989 | Nguyen ....................... 204/15 |
| 4,857,241 A | 8/1989 | Straw et al. ................. 261/152 |
| 4,859,241 A | 8/1989 | Grundy ...................... 106/114 |
| 4,877,451 A | 10/1989 | Winnik et al. ................. 106/23 |
| 4,877,647 A | 10/1989 | Klabunde ................... 427/123 |

(Continued)

FOREIGN PATENT DOCUMENTS

EP 0 410 765 A3 7/1990

(Continued)

OTHER PUBLICATIONS

Yang, Q.B., et al., "Preparation and Characterization of a PAN Nanofibre Containing Ag Nanoparticles via Electrospinning" synthetic Metals, 137, pp. 973-974 (2003).

(Continued)

*Primary Examiner*—George Wyszomierski
(74) *Attorney, Agent, or Firm*—Justin L. Krieger; Katten Muchin Rosenman LLP

(57) ABSTRACT

A process for the production of metal nanoparticles. Nanoparticles are formed by combining a metal compound with a solution that comprises a polyol and a substance that is capable of being adsorbed on the nanoparticles. The nanoparticles are precipitated by adding a nanoparticle-precipitating liquid in a sufficient amount to precipitate at least a substantial portion of the nanoparticles and of a protic solvent in a sufficient amount to improve the separation of the nanoparticles from the liquid phase.

71 Claims, No Drawings

U.S. PATENT DOCUMENTS

| | | | |
|---|---|---|---|
| 4,879,104 A | 11/1989 | List et al. | |
| 4,891,242 A | 1/1990 | Ito et al. | 437/53.1 |
| 4,892,798 A | 1/1990 | Lamanna et al. | 430/38 |
| 4,931,168 A | 6/1990 | Watanabe et al. | 204/284 |
| 4,931,323 A | 6/1990 | Manitt et al. | 427/53.1 |
| 4,948,623 A | 8/1990 | Beach et al. | 427/35 |
| 4,959,430 A | 9/1990 | Jonas et al. | 526/257 |
| 5,011,627 A | 4/1991 | Lutz et al. | |
| 5,028,473 A | 7/1991 | Vitriol et al. | 428/137 |
| 5,039,552 A | 8/1991 | Riemer | 427/96 |
| 5,045,141 A | 9/1991 | Salensky et al. | 156/240 |
| 5,049,434 A | 9/1991 | Wasulko | 428/202 |
| 5,057,363 A | 10/1991 | Nakanishi | 428/321.5 |
| 5,059,242 A | 10/1991 | Firmstone et al. | 106/1.23 |
| 5,075,262 A | 12/1991 | Nguyen et al. | 501/19 |
| 5,091,003 A | 2/1992 | Boaz | 106/20 |
| 5,121,127 A | 6/1992 | Toriyama | 343/700 |
| 5,132,248 A | 7/1992 | Drummond et al. | 437/173 |
| 5,139,818 A | 8/1992 | Mance | 427/54.1 |
| 5,148,355 A | 9/1992 | Lowe et al. | |
| 5,153,023 A | 10/1992 | Orlowski et al. | 427/555 |
| 5,160,366 A | 11/1992 | Shibata | 75/232 |
| 5,173,330 A | 12/1992 | Asano et al. | 427/558 |
| 5,176,744 A | 1/1993 | Muller | 106/1.26 |
| 5,176,764 A | 1/1993 | Abbott et al. | 152/158 |
| 5,183,784 A | 2/1993 | Nguyen et al. | 501/19 |
| 5,215,820 A | 6/1993 | Hosokawa et al. | 428/403 |
| 5,216,207 A | 6/1993 | Prabhu et al. | 174/256 |
| 5,244,538 A | 9/1993 | Kumar | 156/643 |
| 5,250,229 A | 10/1993 | Hara et al. | 252/518 |
| 5,270,368 A | 12/1993 | Lent et al. | 524/236 |
| 5,281,261 A | 1/1994 | Lin | |
| 5,312,480 A | 5/1994 | Lotze et al. | 106/1.13 |
| 5,312,674 A | 5/1994 | Haertling et al. | 428/210 |
| 5,329,293 A | 7/1994 | Liker | 347/11 |
| 5,332,646 A | 7/1994 | Wrigt et al. | 430/137 |
| 5,366,760 A | 11/1994 | Fujii et al. | 427/96 |
| 5,378,408 A | 1/1995 | Carroll et al. | 252/514 |
| 5,378,508 A | 1/1995 | Castro et al. | 427/556 |
| 5,384,953 A | 1/1995 | Economikos et al. | 29/846 |
| 5,395,452 A | 3/1995 | Kobayashi et al. | 118/715 |
| 5,403,375 A | 4/1995 | Konig et al. | 75/255 |
| 5,421,926 A | 6/1995 | Yukonobu et al. | 156/83 |
| 5,433,893 A | 7/1995 | Jost et al. | 252/514 |
| 5,444,453 A | 8/1995 | Lalezari | 343/700 |
| 5,463,057 A | 10/1995 | Graetzel et al. | 546/4 |
| 5,494,550 A | 2/1996 | Benge | 156/268 |
| 5,501,150 A | 3/1996 | Leenders et al. | 101/466 |
| 5,539,041 A | 7/1996 | Arnold et al. | 524/494 |
| 5,559,057 A | 9/1996 | Goldstein | 437/228 |
| 5,565,143 A | 10/1996 | Chan | 252/514 |
| 5,571,311 A | 11/1996 | Belmont et al. | |
| 5,587,111 A | 12/1996 | Watanabe et al. | 252/514 |
| 5,599,046 A | 2/1997 | Behm et al. | 283/83 |
| 5,601,638 A | 2/1997 | Fukuda et al. | 106/19 |
| 5,604,027 A | 2/1997 | Sheridan | 428/323 |
| 5,604,673 A | 2/1997 | Washburn et al. | 363/147 |
| 5,645,932 A | 7/1997 | Uchibori | 428/347 |
| 5,665,472 A | 9/1997 | Tanaka et al. | 428/402 |
| 5,679,724 A | 10/1997 | Sacripante et al. | 523/161 |
| 5,712,673 A | 1/1998 | Hayashi et al. | 347/217 |
| 5,716,663 A | 2/1998 | Capote et al. | 427/96 |
| 5,725,647 A | 3/1998 | Carlson et al. | 106/31.86 |
| 5,725,672 A | 3/1998 | Schmitt et al. | 118/715 |
| 5,746,868 A | 5/1998 | Abe | 156/247 |
| 5,747,222 A | 5/1998 | Ryu | 430/312 |
| 5,747,562 A | 5/1998 | Mahmud et al. | |
| 5,750,194 A | 5/1998 | Watanabe et al. | 427/216 |
| 5,751,325 A | 5/1998 | Leenders et al. | 347/96 |
| 5,759,230 A | 6/1998 | Chow et al. | |
| 5,759,712 A | 6/1998 | Hockaday | 429/30 |
| 5,767,810 A | 6/1998 | Hagiwara et al. | 343/700 |
| 5,781,158 A | 7/1998 | Ko et al. | 343/700 |
| 5,801,108 A | 9/1998 | Huang et al. | 501/32 |
| 5,826,329 A | 10/1998 | Roth | 29/846 |
| 5,828,271 A | 10/1998 | Stitzer | 333/24.1 |
| 5,837,041 A | 11/1998 | Bean et al. | 106/31.6 |
| 5,837,045 A | 11/1998 | Johnson et al. | 106/31.85 |
| 5,838,271 A | 11/1998 | Park | 341/144 |
| 5,838,567 A | 11/1998 | Boggio, Jr. | |
| 5,846,615 A | 12/1998 | Sharma et al. | 427/597 |
| 5,853,470 A | 12/1998 | Martin et al. | 106/31.86 |
| 5,879,715 A | 3/1999 | Higgins et al. | 424/489 |
| 5,882,722 A | 3/1999 | Kydd | 427/123 |
| 5,894,038 A | 4/1999 | Sharma et al. | 427/554 |
| 5,909,083 A | 6/1999 | Asano et al. | 313/584 |
| 5,930,026 A | 7/1999 | Jacobson et al. | 359/296 |
| 5,932,280 A | 8/1999 | Roth | 427/102 |
| 5,953,037 A | 9/1999 | Hayashi et al. | 347/172 |
| 5,962,085 A | 10/1999 | Hayashi et al. | 427/585 |
| 5,966,580 A | 10/1999 | Watanabe et al. | 419/9 |
| 5,992,320 A | 11/1999 | Kosaka et al. | 101/401.1 |
| 5,997,044 A | 12/1999 | Behm et al. | 283/83 |
| 5,998,085 A | 12/1999 | Isberg et al. | 430/200 |
| 6,019,926 A | 2/2000 | Southward et al. | 264/216 |
| 6,025,026 A | 2/2000 | Smith et al. | 427/316 |
| 6,027,762 A | 2/2000 | Tomita et al. | 427/96 |
| 6,036,889 A | 3/2000 | Kydd | 252/512 |
| 6,042,643 A | 3/2000 | Belmont et al. | |
| 6,074,725 A | 6/2000 | Kennedy | 428/188 |
| 6,080,261 A | 6/2000 | Popat et al. | 156/240 |
| 6,099,897 A | 8/2000 | Sayo et al. | 427/180 |
| 6,103,393 A | 8/2000 | Kodas et al. | 428/570 |
| 6,103,868 A | 8/2000 | Heath et al. | 528/482 |
| 6,109,175 A | 8/2000 | Kinoshita | 101/170 |
| 6,118,426 A | 9/2000 | Albert et al. | |
| 6,124,851 A | 9/2000 | Jacobson | 345/206 |
| 6,133,147 A | 10/2000 | Rhee et al. | 438/677 |
| 6,143,356 A | 11/2000 | Jablonski | 427/96 |
| 6,153,348 A | 11/2000 | Kydd et al. | 430/119 |
| 6,156,837 A | 12/2000 | Branan, Jr. et al. | |
| 6,169,129 B1 | 1/2001 | Mahmud et al. | |
| 6,169,837 B1 | 1/2001 | Kato et al. | |
| 6,177,151 B1 | 1/2001 | Chrisey et al. | 427/596 |
| 6,190,731 B1 | 2/2001 | Tecle | 427/213.3 |
| 6,197,147 B1 | 3/2001 | Bonsel et al. | 156/269 |
| 6,197,366 B1 | 3/2001 | Takamatsu | 427/125 |
| 6,200,405 B1 | 3/2001 | Nakazawa et al. | 156/248 |
| 6,207,268 B1 | 3/2001 | Kosaka et al. | 428/325 |
| 6,214,259 B1 | 4/2001 | Oda et al. | 252/500 |
| 6,214,520 B1 | 4/2001 | Wolk et al. | 430/273.1 |
| 6,238,734 B1 | 5/2001 | Senzaki et al. | 427/226 |
| 6,245,494 B1 | 6/2001 | Andriessen et al. | 430/346 |
| 6,251,471 B1 | 6/2001 | Granoff et al. | 427/97 |
| 6,251,488 B1 | 6/2001 | Miller et al. | 427/596 |
| 6,270,389 B1 | 8/2001 | Kobayashi et al. | 445/24 |
| 6,274,412 B1 | 8/2001 | Kydd et al. | 438/149 |
| 6,277,740 B1 | 8/2001 | Goldstein | 438/660 |
| 6,294,401 B1 | 9/2001 | Jacobson et al. | 438/99 |
| 6,296,896 B1 | 10/2001 | Takahashi et al. | 427/77 |
| 6,317,023 B1 | 11/2001 | Felten | 338/254 |
| 6,323,096 B1 | 11/2001 | Saia et al. | 438/384 |
| 6,328,894 B1 | 12/2001 | Chan et al. | 210/638 |
| 6,329,899 B1 | 12/2001 | Hunt et al. | 338/308 |
| 6,338,809 B1 | 1/2002 | Hampden-Smith et al. | 264/7 |
| 6,348,295 B1 | 2/2002 | Griffith et al. | 430/198 |
| 6,356,234 B1 | 3/2002 | Harrison et al. | |
| 6,358,567 B2 | 3/2002 | Pham et al. | 427/421 |
| 6,358,611 B1 | 3/2002 | Nagasawa et al. | 428/403 |
| 6,368,378 B2 | 4/2002 | Sasaki | 75/252 |
| 6,372,158 B1 | 4/2002 | Hashimoto et al. | 252/513 |
| 6,379,742 B1 | 4/2002 | Behm et al. | 427/7 |
| 6,379,745 B1 | 4/2002 | Kydd et al. | 427/96 |
| 6,380,778 B2 | 4/2002 | Uehara et al. | 327/175 |

| Patent Number | Date | Inventor | Class |
|---|---|---|---|
| 6,395,053 B1 | 5/2002 | Fau et al. | 75/362 |
| 6,399,230 B1 | 6/2002 | Tormey et al. | 428/702 |
| 6,416,150 B1 | 7/2002 | Kimura | 347/14 |
| 6,458,327 B1 | 10/2002 | Vossmeyer | 422/68.1 |
| 6,458,431 B2 | 10/2002 | Hill et al. | 427/537 |
| 6,467,897 B1 | 10/2002 | Wu et al. | 347/102 |
| 6,487,774 B1 | 12/2002 | Nakao et al. | 29/890.1 |
| 6,501,663 B1 | 12/2002 | Pan | |
| 6,503,831 B2 | 1/2003 | Speakman | 438/674 |
| 6,537,359 B1 | 3/2003 | Spa | 106/31.92 |
| 6,541,433 B2 | 4/2003 | Schultz et al. | 510/152 |
| 6,548,036 B2 | 4/2003 | Iida et al. | |
| 6,599,631 B2 | 7/2003 | Kambe et al. | 428/447 |
| 6,645,569 B2 | 11/2003 | Cramer et al. | 427/466 |
| 6,649,138 B2 | 11/2003 | Adams et al. | 423/403 |
| 6,660,680 B1 | 12/2003 | Hampden-Smith et al. | 502/180 |
| 6,667,360 B1 | 12/2003 | Ng et al. | 524/492 |
| 6,713,389 B2 | 3/2004 | Speakman | 438/674 |
| 6,730,400 B1 | 5/2004 | Komatsu et al. | 428/403 |
| 6,743,319 B2 | 6/2004 | Kydd | 156/230 |
| 6,753,108 B1 | 6/2004 | Hampden-Smith et al. | 429/44 |
| 6,773,614 B2 | 8/2004 | Field | 216/5 |
| 6,774,036 B2 | 8/2004 | Goldstein | 438/660 |
| 6,780,765 B2 | 8/2004 | Goldstein | 438/660 |
| 6,811,885 B1 | 11/2004 | Andriessen et al. | 428/464 |
| 6,827,772 B2 | 12/2004 | Foster | |
| 6,830,778 B1 | 12/2004 | Schulz et al. | 427/123 |
| 6,855,196 B2 | 2/2005 | Kawamura et al. | 106/31.6 |
| 6,880,909 B2 | 4/2005 | King et al. | 347/19 |
| 6,881,239 B2 | 4/2005 | Uchida | 75/252 |
| 6,939,576 B2 | 9/2005 | Deshpande et al. | 427/223 |
| 6,951,666 B2 | 10/2005 | Kodas et al. | 427/376.6 |
| 2001/0004477 A1 | 6/2001 | Fukunaga et al. | 427/475 |
| 2001/0017085 A1 | 8/2001 | Kubo | |
| 2002/0006723 A1 | 1/2002 | Goldstein | 438/660 |
| 2002/0018861 A1 | 2/2002 | Hill et al. | 427/532 |
| 2002/0020491 A1 | 2/2002 | Price et al. | 156/307.1 |
| 2002/0058143 A1 | 5/2002 | Hunt et al. | 428/412 |
| 2002/0079832 A1 | 6/2002 | Van Tongeren et al. | 313/504 |
| 2002/0131254 A1 | 9/2002 | Schaper | 361/760 |
| 2002/0148640 A1 | 10/2002 | Holl et al. | 174/256 |
| 2002/0150678 A1 | 10/2002 | Cramer et al. | 427/212 |
| 2002/0151161 A1 | 10/2002 | Furusawa | 438/597 |
| 2002/0176987 A1 | 11/2002 | Yadav et al. | 428/402 |
| 2003/0009726 A1 | 1/2003 | Chang et al. | |
| 2003/0020768 A1 | 1/2003 | Renn | 347/2 |
| 2003/0060038 A1 | 3/2003 | Sirringhaus et al. | |
| 2003/0063155 A1 | 4/2003 | Nakao et al. | 347/44 |
| 2003/0070569 A1 | 4/2003 | Bulthaup et al. | 101/127 |
| 2003/0070747 A1 | 4/2003 | Kydd | 156/233 |
| 2003/0073042 A1 | 4/2003 | Cernigliaro et al. | 430/321 |
| 2003/0082485 A1 | 5/2003 | Bulthaup et al. | 430/312 |
| 2003/0083203 A1 | 5/2003 | Hashimoto | |
| 2003/0085057 A1 | 5/2003 | Hashimoto | |
| 2003/0096056 A1 | 5/2003 | Kawamura et al. | 427/66 |
| 2003/0102099 A1 | 6/2003 | Yadav et al. | 162/208 |
| 2003/0108664 A1 | 6/2003 | Kodas et al. | 427/125 |
| 2003/0110978 A1 | 6/2003 | Abe et al. | 106/31.13 |
| 2003/0116057 A1 | 6/2003 | Suzuki et al. | 106/31.33 |
| 2003/0123259 A1 | 7/2003 | Furuya et al. | 362/489 |
| 2003/0124259 A1 | 7/2003 | Kodas et al. | 427/376.6 |
| 2003/0145680 A1 | 8/2003 | Ichida | 75/252 |
| 2003/0146019 A1 | 8/2003 | Hirai | |
| 2003/0148024 A1 | 8/2003 | Kodas et al. | 427/125 |
| 2003/0151030 A1 | 8/2003 | Gurin | 252/502 |
| 2003/0161959 A1 | 8/2003 | Kodas et al. | 427/376.2 |
| 2003/0168639 A1 | 9/2003 | Cheon et al. | 252/500 |
| 2003/0175411 A1 | 9/2003 | Kodas et al. | 427/58 |
| 2003/0180451 A1 | 9/2003 | Kodas et al. | 427/123 |
| 2003/0183165 A1 | 10/2003 | Kakimoto et al. | 118/35 |
| 2003/0185739 A1 | 10/2003 | Mangold et al. | |
| 2003/0185889 A1 | 10/2003 | Yan et al. | 424/484 |
| 2003/0201244 A1 | 10/2003 | Ogawa | |
| 2003/0207949 A1 | 11/2003 | Klabunde et al. | 516/9 |
| 2003/0211246 A1 | 11/2003 | Kydd et al. | 427/282 |
| 2003/0213614 A1 | 11/2003 | Furusawa et al. | |
| 2003/0215565 A1 | 11/2003 | Chang et al. | |
| 2003/0224104 A1 | 12/2003 | Fukunaga et al. | |
| 2003/0228748 A1 | 12/2003 | Nelson et al. | |
| 2004/0004209 A1 | 1/2004 | Matsuba et al. | 252/518.1 |
| 2004/0030019 A1 | 2/2004 | Kim et al. | 524/431 |
| 2004/0038808 A1 | 2/2004 | Hampden-Smith | |
| 2004/0043691 A1 | 3/2004 | Abe et al. | 445/24 |
| 2004/0058457 A1 | 3/2004 | Huang et al. | 436/524 |
| 2004/0074336 A1 | 4/2004 | Daimon et al. | |
| 2004/0126708 A1 | 7/2004 | Jing et al. | |
| 2004/0140549 A1 | 7/2004 | Miyagawa | |
| 2004/0142165 A1 | 7/2004 | Fujii | |
| 2004/0144958 A1 | 7/2004 | Conaghan et al. | 252/500 |
| 2004/0144959 A1 | 7/2004 | Conaghan et al. | 252/500 |
| 2004/0145858 A1 | 7/2004 | Sakurada | |
| 2004/0151893 A1 | 8/2004 | Kydd et al. | 428/323 |
| 2004/0160465 A1 | 8/2004 | Baker-Smith et al. | |
| 2004/0173144 A1 | 9/2004 | Edwards et al. | 118/300 |
| 2004/0182533 A1 | 9/2004 | Blum et al. | 162/135 |
| 2004/0191695 A1 | 9/2004 | Ray et al. | |
| 2004/0196329 A1 | 10/2004 | Ready | |
| 2004/0201648 A1 | 10/2004 | Sekiya | |
| 2004/0206941 A1 | 10/2004 | Gurin | 252/500 |
| 2004/0223926 A1 | 11/2004 | Kobayashi | |
| 2004/0231594 A1 | 11/2004 | Edwards et al. | 118/719 |
| 2004/0239730 A1 | 12/2004 | Kurosawa | |
| 2004/0247842 A1 | 12/2004 | Koyama et al. | 428/195.1 |
| 2004/0250750 A1 | 12/2004 | Reda et al. | 117/84 |
| 2004/0261700 A1 | 12/2004 | Edwards | |
| 2004/0263564 A1 | 12/2004 | Mackawa | |
| 2004/0265549 A1 | 12/2004 | Kydd | 428/201 |
| 2005/0037614 A1 | 2/2005 | Fukuchi | |
| 2005/0056118 A1 | 3/2005 | Xia et al. | |
| 2005/0078158 A1 | 4/2005 | Magdassi et al. | 347/100 |
| 2005/0116203 A1 | 6/2005 | Takahashi et al. | 252/500 |
| 2005/0207930 A1 | 9/2005 | Yamaguchi | |
| 2005/0238804 A1 | 10/2005 | Garbar | |
| 2006/0001726 A1 | 1/2006 | Kodas et al. | |
| 2006/0047014 A1 | 3/2006 | Hopper et al. | |
| 2006/0083694 A1 | 4/2006 | Kodas et al. | |
| 2006/0158497 A1 | 7/2006 | Vanheusden et al. | |
| 2006/0159603 A1 | 7/2006 | Vanheusden et al. | |
| 2006/0162497 A1 | 7/2006 | Kodas et al. | |
| 2006/0163744 A1 | 7/2006 | Vanheusden et al. | |
| 2006/0165898 A1 | 7/2006 | Kodas et al. | |
| 2006/0165910 A1 | 7/2006 | Kodas et al. | |
| 2006/0166057 A1 | 7/2006 | Kodas et al. | |
| 2006/0176350 A1 | 8/2006 | Howarth et al. | |

FOREIGN PATENT DOCUMENTS

| | | |
|---|---|---|
| EP | 0 449 309 B9 | 3/1991 |
| EP | 0 537 502 B1 | 9/1992 |
| EP | 0 641 670 B1 | 8/1994 |
| EP | 0 696 515 B1 | 5/1995 |
| EP | 0 824 138 A2 | 7/1997 |
| EP | 0 930 641 A3 | 1/1999 |
| EP | 0 995 718 B1 | 9/1999 |
| EP | 0 977 212 A2 | 2/2000 |
| EP | 0 982 090 A1 | 3/2000 |
| EP | 1 083 578 A1 | 3/2001 |
| EP | 1 107 298 A2 | 6/2001 |
| EP | 1 339 073 A1 | 9/2001 |
| EP | 1 302 895 A3 | 4/2002 |
| EP | 1 335 393 A1 | 4/2002 |
| EP | 1 426 978 A1 | 8/2002 |
| EP | 0 995 718 B1 | 11/2002 |
| EP | 1 493 780 A1 | 4/2003 |
| EP | 1 323 793 A1 | 7/2003 |
| EP | 1 340 568 A1 | 9/2003 |

| | | |
|---|---|---|
| EP | 1 342 760 A1 | 9/2003 |
| EP | 1 544 905 A1 | 9/2003 |
| EP | 1 571 186 A1 | 2/2005 |
| EP | 1 515 348 A2 | 3/2005 |
| JP | 62-113164 | 5/1987 |
| JP | 01-303787 | 7/1989 |
| JP | 2002-124016 | 5/1990 |
| JP | 2000-011875 | 1/2000 |
| JP | 2000-182889 | 6/2000 |
| JP | 2001-167633 | 6/2001 |
| JP | WO 03/051562 A1 | 6/2003 |
| JP | 2004-311725 | 4/2004 |
| JP | 2005-191059 | 7/2005 |
| JP | 2005-219873 | 8/2005 |
| JP | WO 2004/030072 A1 | 1/2006 |
| WO | WO 89/05567 | 6/1989 |
| WO | WO 97/48257 | 12/1997 |
| WO | WO 98/08362 | 2/1998 |
| WO | WO 98/37133 A1 | 8/1998 |
| WO | WO 99/16556 A1 | 4/1999 |
| WO | WO 99/16601 A1 | 4/1999 |
| WO | WO 99/17351 A1 | 4/1999 |
| WO | WO 99/61911 | 12/1999 |
| WO | WO 00/10197 A | 2/2000 |
| WO | WO 00/10736 | 3/2000 |
| WO | WO 00/29208 A1 | 5/2000 |
| WO | WO 00/69235 A1 | 11/2000 |
| WO | WO 00/72224 A1 | 11/2000 |
| WO | WO 01/54203 A2 | 7/2001 |
| WO | WO/01/56736 A2 | 8/2001 |
| WO | WO 01/82315 A1 | 11/2001 |
| WO | WO 01/87503 A1 | 11/2001 |
| WO | WO 02/04698 A2 | 1/2002 |
| WO | WO 02/05294 A1 | 1/2002 |
| WO | WO 02/098576 A1 | 12/2002 |
| WO | WO 03/018645 A1 | 3/2003 |
| WO | WO 03/032084 A2 | 4/2003 |
| WO | WO 03/035279 A1 | 5/2003 |
| WO | WO 03/038002 A1 | 5/2003 |
| WO | WO 03/106573 A1 | 12/2003 |
| WO | WO 2004/005413 A1 | 1/2004 |
| WO | WO 2004/027787 A1 | 4/2004 |
| WO | WO 2004/050260 A3 | 6/2004 |
| WO | WO 2004/050350 A1 | 6/2004 |
| WO | WO 2004/062890 A2 | 7/2004 |
| WO | WO 2004/063295 A1 | 7/2004 |
| WO | WO 2004/068918 A3 | 8/2004 |
| WO | WO 2004/075211 | 9/2004 |
| WO | WO 2004/078641 A1 | 9/2004 |
| WO | WO 2004/104153 A1 | 12/2004 |
| WO | WO 2004/105985 A1 | 12/2004 |
| WO | WO 2005/044451 A1 | 5/2005 |
| WO | WO 2006/061557 A1 | 6/2006 |

OTHER PUBLICATIONS

Advanced Materials Systems for Ultra-Low-Temperature, Digital, Direct-Write Technologies, Digital, Direct Write Technologies, Vanheusden, et al., "Direct-Write Technologies for Rapid Prototyping Applications", pp. 123-173 (2001).
Dispersion and Stability of Silver Inks, Tay, et al., "Journal of Materials Science" vol. 37, pp. 4653-4661 (2002).
Ethylene Glycol-Mediated Synthesis of Metal Oxide Nanowires, X. Jiang, Y. Wang, T. Herricks, Y. Xia, "Journal of Materials Chemistry" 14, 695-703 (2004).
Fine Line Conductor Manufacturing Using Drop-On-Demand PZT Printing Technology, Szczech, et al. "IEEE Transactions on Electronics Packaging Manufacturing" vol. 25, No. 1 (2002).
Gold and Silve Nanoparticles: A Class of Chromophores with Colors Tunable in the Range from 400 to 750 nm, Y. Sun, Y. Xia, "The Analyst, The Royal Scoiety of Chemistry" 128, 686-691 (2003).
Ink Jet Printing of Hybrid Circuits, R.W. Vest, Tweedell and B.C. Buchanan, "Hybrid Microelectronics" 6, 261, 267 (1983).
Ink-Jet Printed Nanoparticle Microelectromechanical Systems, Fuller, et al., "Journal of Microelectromechanical Systems" vol. 11, No. 1 (2002).
Ink-Jet Printing of Catalyst Patterns for Electroless Metal Deposition, Shah, et al., "American Chemical Society" 15, 1584-1587 (1999).
Large-Scale Synthesis of Monodisperse Nanorods of Se/Te Alloys Through A Homogeneous Nucleation and Solution Growth Process, B. Mayers, B. Gates, Y. Yin, Y. Xia, "Advanced Materials" 13, No. 18 (2001).
Large-Scale Synthesis of Silver Nanocubes: The Role of HICI in Promoting Cube Perfection and Monodispersity, S.H. Im, Y.T. Lee, B. Wiley, Y. Xia "Angewandte Chemical International Edition" 44, 2154-2157 (2005).
Large-Scale Synthesis of Uniform Silver Nanowires through A Soft, Self-Seeding, Polyol Process "Advanced Materials" 14, No. 11 (2002).
Late-News Paper: Inkjet-Printed Bus and Address Electrodes For Plasma Display, Furusawa, et al., "SID 02 Digest" pp. 753-755.
Liquid Ink Jet Printing With MOD Inks for Hybrid Microcircuits, K.F. Teng, R.W. Vest "IEEE Transaction on Components, Hybrids and Manufacturing Technology" vol. CHMT-12, No. 4, 545-549 (1987).
Materials, Silver Ink for Jet Printing "NASA Tech Briefs" Aug. 1989.
Microwave-polyol Process for Metal Nanophases, S. Komarneni, H. Katsuki, D. Li, A.S. Bhalla "Journal of Physics, Condensed Matter" 16, S1305-S1312 (2004).
New Development of Nonlinear Optical Crystals for the Ultraviolet Region with Molecular Engineering Approach, C. Chen, Y. Wang, Y. Xia, B. Wu, D. Tang, K. Wu, Z. Wenrong, L. Yu, L. Mei "Journal of Applied Physics" 77, (6) 1995).
New Nonlinear Optical Crystals for UV and VUV Harmonic Generation, Y. Xia, C. Chen, D. Tang, B Wu Advanced Materials: 7, No. 1 (1995)
Physical Mechanisms Governing Pattern Fidelity in Microscale Offset Printing, Darhuber, et al. "Journal of Applied Physics", vol. 90, No. 7, pp. 3602-3609 (2001).
Polyol Synthesis of Uniform Silver Nanowires: A Plausible Growth Mechanism and the Supporting Evidence, Y. Sun, B Mayers, T. Herricks, Y. Xia "Nano Letters" vol. 3, No. 7, 955-960 (2003).
Polyol Synthesis of Silver Nanoparticles: Use of Choloride and Oxygen to Promote the Formation of Single-Crystal, Truncated Cubes and Tetrahedrons, B. Wiley, T. Herricks, Y. Sun, Y. Xia "Nano Letters" vol. 4, No. 9, 1733-1739 (2004).
Polyol Synthesis of Platinum Nanoparticles: Control of Morphology with Sodium Nitrate, T. Herricks, J. Chen, Y. Xia "Nano Letters" vol. 4, No. 12, 2367-2371 (2004).
Polyol Synthesis of Platinum Nanostructures: Control of Morphology Through the Manipulation of Reduction Kinetics, J. Chen, T. Herricks, Y. Xia "Angewandte Chemical International Edition" 44, 2589-2592 (2005).
Polyol Synthesis of Silver Nanostructures: Control of Product Morphology with Fe(II) or Fe(III) Species, B. Wiley, Y. Sun, Y. Xia "Langmuir The ACS Journal of Surfaces and Colloids" Vo 21, No. 18 (2005).
Preparation and Characterization of Nano-Sized Ag/PVP Composites for Optical Applications, G Carotenuto, G.P. Pepe, L. Nicolais "The European Physical Journal B" 16, 11-17 (2000).
Preparation of Colloidal Silver Dispersions By The Polyol Process Part 1—Synthesis and Characterization, P.Y. Silvert, R. Herrera-Urbina, N. Duvauchelle, V. Vijayakrishan, K. Tekaia-Elhsissen "Journal of Materials Chemistry" 6(4), 573-577 (1996).
Preparation of Colloidal Silver Dispersion By The Polyol Process Part 2—Mechanism of Particle Formation, P.-Y. Silvert, R. Herrera-Urbina, K. Tekaia-Elhsissen "Journal of Materials Chemistry" 7(2), 293-299 (1997).
Preparation of Gold, Platinum, Palladium and Silver Nanoparticles by the Reduction of their Salts with a Weak Reductant-Potassium Bitartrate, Y. Tan, X. Dai, Y. Li, D. Zhu "Journal of Materials Chemistry" 13, 1069-1075 (2003).
Preparation of Polychrome Silver Nanoparticles in Different Solvents, R. He, X. Qian, J. Yin, Z. Zhu "Journal of Materials Chemistry" 12, 3783-3786 (2002).

PVP Protective Mechanism of Ultrafine Silve Powder Synthesized by Chemical Reduction Processes, Z. Zhang, B. Zhao, L. Hu "Journal of Solid State Chemistry" 121, 105-110, Article No. 0015 (1996).
Shape-Controlled Synthesis of Gold and Silver Nanoparticles, Y. Sun, Y. Xia "Science Magazine" vol. 298, pp. 2176-2179 (2002).
Shape-Controlled Synthesis of Silver and Gold Nanostructures, B. Wiley, Y. Sun, J. Chen, H. Cang, Z.Y. Li, X. Li, Y. Xia "MRS Bulletin" vol. 30 (2005).
Silver Nanowires Can Be Directly Coated with Amorphous Silica to Generate Well-Controlled Coaxial Nanocables of Silver/Silica, Y. Yin, Y. Lu, Y. Sun, Y. Xia "Nano Letters" vol. 2, No. 4, 427-430 (2002).
Site Selective Copper and Silver Electroless Metallization Facilitated by a Photolithographically Patterned Hydrogen Silsesquioxane Mediated Seed Layer, Harness, et al. "American Chemical Society".
Snythesis of Monodisperse Au, Pt, Pd, Ru and Ir Nanoparticles in Ethylene Glycol, F.Bonet, V. Delmas, S. Grugeon, R. Herrera Urbina, P-Y. Silvert, K. Tekaia-Elhsissen "NanoStructured Materials" vol. 11, No. 8, pp. 1277-1284 (1999).
Synthesis of Monodisperse Submicronic Gold Particles by the Polyol Process, P-Y. Silvert, K. Tekaia-Elhsissen "Solid State Ionics" 82, 53-60 (1995).
Tape Compositions For The Deposition of Electronic Features, T. Kodas, U.S. Appl. No. 10/274,495, filed Oct. 18, 2002.
Transformation of Silver Nanospheres into Nanobelts and Triangular Nanoplates Through a Thermal Process, Y. Sun, B. Mayers, Y. Xia "Nano Letters" vol. 3, No. 5, 675-679 (2003).
Triangular Nanoplates of Silver: Synthesis, Characterization, and Use as Sacrificial Templates for Generating Triangular Nanorings of Gold, Y. Sun, Y. Xia "Advanced Materials" 15, No. 9 (2003).
Uniform Silver Nanowires Synthesis by Reducing AgNO3 with Ethylene Glycol in the Presence of Seeds and Poly(Vinyl Pyrrolidone), Y. Sun, Y. Yin, B.T. Mayers, T. Herricks, Y. Xia "Chemical Materials" 14, 4736-4745 (2002).
ITT Cuts Costs of PC Board Manufacturing, K. Dreyfack, "Electronics" vol. 52, No. 17 (1979).
(2005) "How Printable Computers Will Work", Worldwide Web Reference Source, http://computer.howstuffworks.com/printable-computer.htm/printable Date Retrieved: May 23, 2005.
(2005) "Definitions of inkjet printer on the Web:", Worldwide Web Reference Source, http://www.google.com/search?hl=en&lr=&oi+defmore&q=define:inkjet+printer Date Retrieved: May 23, 2005.
(2005) "Screen Printing Technology, Principles of Screen-printing", Worldwide Web Reference Source, http://www.spauk.co.uk/TechnicalPages/Screen%20TP.pdf Date Retrieved: May 3, 2006.
(Unknown) "Lithography—definition of Lithography in Encyclopedia", Worldwide Web Reference Source, http://encyclopedia.laborlawtalk.com/Lithography Date Retrieved: May 25, 2005.
(2006) "Photolithography: Definition and Much More From Answers.com", Worldwide Web Reference Source, http://www.answers.com/topic/photolithography Date Retrieved: May 25, 2005.
(Dec. 3, 2002) "Printing Drawings and Photographic Images", Worldwide Web Reference Source, http://histclo.hispeed.com/photo/photo-print.html Date Retrieved: May 25, 2005.
(Apr. 5, 2006) "Photolithography", Worldwide Web Reference Source, http://www.ece.gatech.edu/research/labs/vc/theory/photolith.html Date Retrieved: May 25, 2005.
Measurement of Clay Surface Areas by Polyvinylpyrrolidone (PVP) Sorption and Its Use for Quantifying Illite and Smectite Abundance, A.E. Blum, D.D. Eberl, "Clays and Clay Mineals", vol. 52, No. 5, 589-602 (2004).
Metal Nanoparticle Compositions, Vanheusden, et al. U.S. Appl. No. 11/331,211, filed Jan. 13, 2006.
Separation of Metal Nanoparticles, Vanheusden, et al. U.S. Appl. No. 11/331,238, filed Jan. 13, 2006.
Production of Metal Nanoparticles, Vanheusden, et al. U.S. Appl. No. 11/331,230, filed Jan. 13, 2006.
Replacement of Passive Electrical Components, Howarth, et al. U.S. Appl. No. 11/331,186, filed Jan. 13, 2006.
Circuit Modeling and Selective Deposition, Howarth, et al. U.S. Appl. No. 11/331,188, filed Jan. 13, 2006.
Ink-Jet Printing of Compositionally Non-Uniform Features, Vanheusden, et al. U.S. Appl. No. 11/331,237, filed Jan. 13, 2006.
Printable Electronic Features on Non-Uniform Substrate and Processes for Making Same, Vanheusden, et al., U.S. Appl. No. 11/331,190, filed Jan. 13, 2006.
Controlling Ink Migration During the Formation of Printable Electronic Features, Kowalski, et al., U.S. Appl. No. 11/331,185, filed Jan. 13, 2006.
Processes for Planarizing Substrates and Enapsulating Printable Electronic Features, Mark Kowalski, U.S. Appl. No. 11/331,239, filed Jan. 13, 2006.
Optimized Multi-Layer Printing of Electroics and Displays, Edwards, et al. U.S. Appl. No. 11/331,187, filed Jan. 13, 2006.
A System and Process for Manufacturing Application Specific Printable Circuits (ASPC's) and Other Custom Electronic Devices, Chuck Edwards, U.S. Appl. No. 11/331,189, filed Jan. 13, 2006.
A System and Process for Manufacturing Custom Electronics by Combining Traditional Electronics With Printable Electronics, Chuck Edwards, U.S. Appl. No. 11/331,191, filed Jan. 13, 2006.
Security Features, Their Use, and Processes For Making Them, Hampden-Smith, et al. U.S. Appl. No. 11/331,233, filed Jan. 13, 2006.
All-Polymer Thin Film Transistors Fabricated by High-Resolution Ink-Jet Printing, Kawase, T., et al. "IEEE International Electron Devices Meeting", pp. 25.5.1-25.5.4 (2000).
All-Polymer Thin Film Transistor Fabricated by High-Resolution Ink-Jet Printing, Shimoda, T., et al. "IEEE International Solid State Circuits Conference", Session 16 (2004).
Custom Color Liquid Ink Development (LID) Process, Goodman, N.B., "Xerox Disclosure Journal", vol. 21, No. 2, p. 157 (1996).
Ink Jet Color Copier and Universal Printer, Pearson, R.C., et al. "IBM Technical Disclosure Bulletin", vol. 16, No. 1, pp. 144-145 (1973).
Inkjet Printing of Nanosized Silver Colloids, Lee, H-H, et al., "Nanotechnology" 16, pp. 2436-2441 (2005).
Monolayer-Protected Clusters: Molecular Precursors to Metal Films "Chemical Materials", 13, pp. 87-95 (2001).
Oligomeric Ketoester Precursors For Improved Polyimide Planarization and Gapfilling "IBM Technical Disclosure Bulletin", vol. 30, No. 1, pp. 343-346 (1987).
Porosity-Grain Growth Relationships in the Sintering of Nanocrystalline Ceramics "NanoStructured Materials", vol. 3, pp. 43-52 (1993).
Smoothing of Irregular $SiO_2$ Surfaces, Spencer, O.S. "IBM Technical Disclosure Bulletin", vol. 20, No. 11B, pp. 4842-4843 (1978).
Blum, A.E., et al., "Measurement of Clay Surface Areas By Polyvinylpyrrolidone (PVP) Sorption and Its Use For Quantifying Illite and Smectite Abundance", *Clays and Clay Minerals*, vol. 52, No. 5, pp. 589-602 (2004).
Carotenuto, G., et al., "A Qualitative Model for the Growth Mechanism of Silver Clusters in Polymer Solution", *The European Physical Journal B*, 24, pp. 437-441 (2001).
Fievet, F., et al., "Preparing Monodisperse Metal Powders I Micrometer and Submicrometer Sizes by the Polyol Process", *MRS Bulletin*, Dec. 1989.
Lee, H.K., et al., "One-step preparation of ultrafine poly(acrylonitrile) fibers containing silver nanoparticles", *Materials Letters*, pp. 2977-2980 (2005).
Wiley, B et al., "Shape-Controlled Synthesis of Metal Nanostructures: The Case of Silver", *Chemistry, A European Journal*, 11, pp. 454-463 (2005).

SEPARATION OF METAL NANOPARTICLES

This application claims the benefit of U.S. Provisional Application Ser. Nos. 60/643,577; 60/643,629; and 60/643,578, all filed on Jan. 14, 2005, the entireties of which are all incorporated herein by reference.

STATEMENT REGARDING FEDERALLY-SPONSORED RESEARCH/DEVELOPMENT

This invention was made with Government support under Agreement No. MDS972-93-2-0014 or DAAD19-02-3-0001 awarded by the Army Research Laboratory ("ARL"). The Government has certain rights in the invention.

BACKGROUND OF THE INVENTION

1. Field of the Invention

The present invention relates to a process for the production of metal nanoparticles wherein a metal compound is reduced by a polyol in the presence of a substance that is capable of being adsorbed on the nanoparticles and wherein the precipitation of the formed nanoparticles by a nanoparticle-precipitating liquid is improved by the addition of a protic solvent.

2. Discussion of Background Information

The production of metal particles by the polyol process is known from, e.g., U.S. Pat. No. 4,539,041 to Figlarz et al., the entire disclosure whereof is expressly incorporated by reference herein. In the polyol process, a metal compound is reduced at an elevated temperature by a polyol to afford the corresponding metal in the form of particles (usually in the micron and nanometer size range). A number of metal compounds and in particular, a number of transition metal compounds can be converted to metal particles by this process. In a typical procedure, a solid metal compound is suspended in a polyol and the suspension is heated until the reduction of the metal compound is substantially complete. Thereafter, the formed particles are isolated by separating them from the liquid phase, e.g., by centrifugation.

A modification of this method is described in, e.g., P.-Y. Silvert et al., "Preparation of colloidal silver dispersions by the polyol process" Part 1—Synthesis and characterization, J. Mater. Chem., 1996, 6(4), 573-577; and Part 2—Mechanism of particle formation, J. Mater. Chem., 1997, 7(2), 293-299. According to the Silvert et al. articles, the entire disclosures whereof are expressly incorporated by reference herein, the polyol process is carried out in the presence of a polymer, i.e., polyvinylpyrrolidone (PVP). In a typical experiment, 1-25 g of PVP was dissolved at room temperature in 75 ml of ethylene glycol and 50-3,200 mg of silver nitrate was added to this solution. The resultant suspension was stirred until the silver nitrate had dissolved completely, whereafter the system was heated until the reaction was complete. It is reported that after cooling with tap water, the silver particles could be easily separated from the ethylene glycol by adding a "large amount of acetone" to the resultant colloidal dispersion, followed by centrifugation.

While the results reported by Silvert et al. are desirable, the present inventors have found that when a corresponding process is scaled up and conducted with a significantly larger amount of metal compound than that described by Silvert et al., even the addition a large amount of a particle-precipitating liquid such as acetone does not afford a satisfactory separation of the metal nanoparticles from the polyol or the liquid phase of the reaction mixture, respectively. In particular, frequently the separation requires unacceptably long periods of time or does not take place at all. Accordingly, it would be advantageous to have available a process of the type described by Silvert et al. which affords satisfactory results in terms of the separation of the nanoparticles from the liquid phase even when it is conducted on a larger scale than that reported by Silvert et al.

SUMMARY OF THE INVENTION

The present invention provides a process for the production of metal nanoparticles by combining a metal compound with a solution that comprises a polyol and a substance that is capable of being adsorbed on the nanoparticles, followed by a precipitation of formed nanoparticles. The precipitation of the nanoparticles is accomplished by adding to the reaction mixture a nanoparticle-precipitating liquid in a sufficient amount to precipitate at least a substantial portion of the nanoparticles. Additionally, a protic solvent is added in a sufficient amount to improve the separation of the nanoparticles from the liquid phase.

In a particularly preferred aspect of this process, the metal compound is or comprises a silver compound, the substance that is capable of being adsorbed on the nanoparticles is or comprises a vinyl pyrrolidone polymer and the protic solvent comprises an alcohol and/or a polyol.

The present invention also provides a method of improving the precipitation of metal nanoparticles from a mixture which comprises the nanoparticles, a polyol and a substance that is capable of being adsorbed on the nanoparticles by adding to the mixture a nanoparticle-precipitating liquid. The improvement comprises adding to the mixture also a protic solvent in a sufficient amount to improve the precipitation of the nanoparticles.

DETAILED DESCRIPTION OF THE PRESENT INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to set forth the present invention in more detail than is necessary for the fundamental understanding of the present invention, the description making apparent to those skilled in the art how the several forms of the present invention may be embodied in practice.

According to the process of the present invention, metal nanoparticles which have been formed by combining a metal compound and a polyol in the presence of a substance that is capable of being adsorbed on the nanoparticles are precipitated from the reaction mixture by adding a nanoparticle-precipitating liquid and, additionally, a protic solvent in a sufficient amount to improve the precipitation.

The use of a protic solvent in addition to the use of a nanoparticle-precipitating liquid will usually (significantly) increase the separation rate of the nanoparticles from the liquid phase (often by a factor of at least about 1.5, e.g., at least about 2). As set forth above, frequently this separation cannot even be accomplished, or can at least not be accomplished within a limited period of time, without the addition of a protic solvent. The use of a protic solvent is particularly advantageous for processes that are carried out on a larger scale, for example, processes where at least about 0.1 mole of the metal compound, e.g., at least about 0.25 mole of the metal compound, or at least about 0.5 mole of the metal compound have been used as a starting material.

The use of a protic solvent also is particularly advantageous for processes where the amount of polyol (solvent) is relatively low, for example, not much higher than the amount that is necessary for dissolving the metal compound and the substance that is capable of being adsorbed on the nanoparticles. These processes are particularly prone to cause problems in the separation of the nanoparticles from the liquid phase.

Another advantage that will often be associated with the use of a protic solvent in the precipitation of the nanoparticles is a substantial reduction or even an elimination of the amount of oily matter (usually comprising or essentially consisting of excess substance that is capable of being adsorbed on the nanoparticles) that may otherwise separate from the liquid phase of the reaction mixture.

Metal Compound

The metal compounds that may be used in the process of the present invention include all metal compounds that a polyol can reduce to the corresponding metal (oxidation state=0). Non-limiting examples of such metals include main group metals such as, e.g., lead, tin, antimony and indium, and transition metals such as, e.g., gold, silver, copper, nickel, cobalt, palladium, platinum, iridium, osmium, rhodium, ruthenium, rhenium, vanadium, chromium, manganese, niobium, molybdenum, tungsten, tantalum, iron and cadmium. Examples of preferred metals include gold, silver, copper and nickel, in particular, silver, copper and nickel. Silver is a particularly preferred metal for the purposes of the present invention.

Non-limiting examples of suitable metal compounds include metal oxides, metal hydroxides (including hydrated oxides), metal salts of inorganic and organic acids such as, e.g., nitrates, nitrites, sulfates, halides (e.g., fluorides, chlorides, bromides and iodides), carbonates, phosphates, azides, borates (including fluoroborates, pyrazolylborates, etc.), sulfonates, carboxylates (such as, e.g., formates, acetates, propionates, oxalates and citrates), substituted carboxylates (including halogenocarboxylates such as, e.g., trifluoroacetates, hydroxycarboxylates, aminocarboxylates, etc.) and salts and acids wherein the metal is part of an anion (such as, e.g., hexachloroplatinates, tetrachloroaurate, tungstates and the corresponding acids).

Further non-limiting examples of suitable metal compounds for the process of the present invention include alkoxides, complex compounds (e.g., complex salts) of metals such as, e.g., beta-diketonates (e.g., acetylacetonates), complexes with amines, N-heterocyclic compounds (e.g., pyrrole, aziridine, indole, piperidine, morpholine, pyridine, imidazole, piperazine, triazoles, and substituted derivatives thereof), aminoalcohols (e.g., ethanolamine, etc.), amino acids (e.g., glycine, etc.), amides (e.g., formamides, acetamides, etc.), and nitriles (e.g., acetonitrile, etc.). Non-limiting examples of preferred metal compounds include nitrates, formates, acetates, trifluoroacetates, propionates, oxalates and citrates, particularly nitrates and acetates.

Non-limiting examples of specific metal compounds for use in the process of the present invention include silver nitrate, silver nitrite, silver oxide, silver fluoride, silver hydrogen fluoride, silver carbonate, silver oxalate, silver azide, silver tetrafluoroborate, silver acetate, silver propionate, silver butanoate, silver ethylbutanoate, silver pivalate, silver cyclohexanebutanoate, silver ethylhexanoate, silver neodecanoate, silver decanoate, silver trifluoroacetate, silver pentafluoropropionate, silver heptafluorobutyrate, silver trichloroacetate, silver 6,6,7,7,8,8,8-heptafluoro-2,2-dimethyl-3,5-octanedionate, silver lactate, silver citrate, silver glycolate, silver glyconate, silver benzoate, silver salicylate, silver phenylacetate, silver nitrophenylacetate, silver dinitrophenylacetate, silver difluorophenylacetate, silver 2-fluoro-5-nitrobenzoate, silver acetylacetonate, silver hexafluoroacetylacetonate, silver trifluoroacetylacetonate, silver tosylate, silver triflate, silver trispyrazolylborate, silver tris(dimethylpyrazolyl)borate, silver ammine complexes, trialkylphosphine and triarylphosphine derivatives of silver carboxylates, silver beta-diketonates, silver beta-diketonate olefin complexes and silver cyclopentadienides; nickel oxide, nickel hydroxide, nickel chloride, nickel nitrate, nickel sulfate, nickel ammine complexes, nickel tetrafluoroborate, nickel oxalate, nickel isopropoxide, nickel methoxyethoxide, nickel acetylacetonate, nickel formate, nickel acetate, nickel octanoate, nickel ethylhexanoate, and nickel trifluoroacetate; platinum formate, platinum acetate, platinum propionate, platinum carbonate, platinum nitrate, platinum perchlorate, platinum benzoate, platinum neodecanoate, platinum oxalate, ammonium hexafluoroplatinate, ammonium tetrachloroplatinate, sodium hexafluoroplatinate, potassium hexafluoroplatinate, sodium tetrachloroplatinate, potassium hexabromoplatinate, hexachloroplatinic acid, hexabromoplatinic acid, dihydrogen hexahydroxoplatinate, diammine platinum chloride, tetraammine platinum chloride, tetraammine platinum hydroxide, tetraammine platinum tetrachloroplatinate, platinum(II) 2,4-pentanedionate, diplatinum trisdibenzylideneacetonate, platinum sulfate and platinum divinyltetramethyldisiloxane; gold(III) acetate, gold(III) chloride, tetrachloroauric acid, gold azide, gold isocyanide, gold acetoacetate, imidazole gold ethylhexanoate and gold hydroxide acetate isobutyrate; palladium acetate, palladium propionate, palladium ethylhexanoate, palladium neodecanoate, palladium trifluoroacetate, palladium oxalate, palladium nitrate, palladium chloride, tetraammine palladium hydroxide, tetraammine palladium nitrate and tetraammine palladium tetrachloropalladate; copper oxide, copper hydroxide, copper nitrate, copper sulfate, copper chloride, copper formate, copper acetate, copper neodecanoate, copper ethylhexanoate, copper methacrylate, copper trifluoroacetate, copper acetoacetate and copper hexafluoroacetylacetonate; cobalt oxide, cobalt hydroxide, cobalt chloride and cobalt sulfate; ruthenium(III) chloride, ruthenium(III) acetylacetonate, ruthenium(III) acetate, ruthenium carbonyl complexes, ruthenium perchlorate, and ruthenium amine complexes; rhodium(III) chloride, rhenium(II) chloride, tin(II) oxide, iron(II) acetate, sodium tungstate and tungstic acid.

Preferred examples of specific metal compounds for use in the process of the present invention include silver nitrate, silver acetate, silver trifluoroacetate, silver oxide, copper oxide, copper hydroxide, copper sulfate, nickel oxide, nickel hydroxide, nickel chloride, nickel sulfate, nickel acetate, cobalt oxide, cobalt hydroxide, cobalt chloride and cobalt sulfate.

The use of mixtures of different compounds, e.g., different salts, of the same metal and/or the use of mixtures of compounds of different metals and/or of mixed metal compounds (e.g., mixed salts and/or mixed oxides) are also contemplated by the present invention. Accordingly, the term "metal compound" as used herein includes both a single metal compound and any mixture of two or more metal compounds. Depending, inter alia, on the metal compounds and reaction conditions employed, the use of more than one metal in the process of the present invention will result in a mixture of nanoparticles of different metals and/or in nanoparticles which comprise different metals in the same nanoparticle, for example, in the form of an alloy or a mixture of these metals. Non-limiting examples of alloys include Ag/Ni, Ag/Cu, Pt/Cu, Ru/Pt, Ir/Pt and Ag/Co.

Polyol

The polyol for use in the present invention may be a single polyol or a mixture of two or more polyols (e.g., three, four or five polyols). In the following description, whenever the term "polyol" is used, this term is meant to include both a single polyol and a mixture of two or more polyols. The polyol may have any number of hydroxyl groups (but at least two) and carbon atoms. Also, the polyol may comprise heteroatoms (such as, e.g., O and N), not only in the form of hydroxyl groups, but also in the form of, e.g., ether, ester, amine and amide groups and the like (for example, it may be a polyester polyol, a polyether polyol, etc.). Preferably, the polyol comprises from about 2 to about 6 hydroxy groups (e.g., 2, 3 or 4 hydroxy groups). Also, the preferred polyol comprises from 2 to about 12 carbon atoms, e.g., up to about 3, 4, 5 or 6 carbon atoms. A particularly preferred group of polyols for use in the present invention are the (alkylene) glycols, i.e., compounds which comprise two hydroxyl groups bound to adjacent (aliphatic or cycloaliphatic) carbon atoms. Usually these glycols will comprise up to about 6 carbon atoms, e.g., 2, 3 or 4 carbon atoms. Ethylene glycol, propylene glycol and the butylene glycols are non-limiting examples of preferred glycols for use in the present invention.

The polyglycols constitute another group of preferred polyols for use in the present invention. Specific and preferred examples thereof are compounds which comprise up to about 6 alkylene glycol units, e.g., up to 4 alkylene glycol units such as, e.g., diethylene glycol, triethylene glycol, tetraethylene glycol, dipropylene glycol and tripropylene glycol.

Non-limiting examples of other specific compounds which may advantageously be used as the or a polyol in the process of the present invention include 1,3-propanediol, 1,3-butanediol, 1,4-butanediol, glycerol, trimethylolpropane, pentaerythritol, triethanolamine and trihydroxymethylaminomethane.

Of course, it also is possible to use other polyols than those mentioned above, either alone or in combination. For example, sugars and sugar alcohols can form at least a part of the polyol reactant of the process of the present invention. While polyols that are solid or semi-solid at room temperature may be employed, it is preferred that the employed polyol or at least the employed mixture of polyols is liquid at room temperature, although this is not mandatory. Further, it is also possible to use one or more other reducing agents in conjunction with the polyol(s), for example, in order to reduce the required reaction time and/or the reaction temperature. For instance, the substance that is capable of being adsorbed on the nanoparticles may exhibit a reducing effect with respect to the metal compound. A non-limiting example of such a substance is polyvinylpyrrolidone.

Adsorptive Substance

One of the functions of the substance that is capable of being adsorbed on the nanoparticles (hereafter frequently referred to as "the adsorptive substance") will usually and preferably be to help preventing a substantial agglomeration of the nanoparticles. Due to their small size and the high surface energy associated therewith, the metal nanoparticles exhibit a strong tendency to agglomerate and form larger secondary particles (for example, soft agglomerates). The adsorptive substance will shield (e.g., sterically and/or through charge effects) the nanoparticles from each other to at least some extent and thereby substantially reduce or prevent a direct contact between the individual nanoparticles. The term "adsorbed" as used herein and in the appended claims includes any kind of interaction between the adsorptive substance and a nanoparticle surface (e.g., the metal atoms on the surface of a nanoparticle) that manifests itself in an at least weak bond between the adsorptive substance and the surface of a nanoparticle. Preferably, the bond is strong enough for the nanoparticle-adsorptive substance combination to withstand a washing operation with a solvent for the adsorptive substance. In other words, merely washing the nanoparticles with the solvent at room temperature will preferably not remove more than minor amounts (e.g., less than about 10%, less than about 5%, or less than about 1%) of that part of the adsorptive substance that is in direct contact with (and (weakly) bonded to) the nanoparticle surface. Of course, adsorptive substance that is not in direct contact with a nanoparticle surface and is merely associated with the bulk of the nanoparticles as a contaminant, i.e., without any significant interaction with the nanoparticles, is preferably removable from the nanoparticles by washing the latter with a solvent for the adsorptive substance. Further, it is also preferred for the bond between the adsorptive substance and nanoparticle to be not too strong and, in particular, to not be a covalent bond.

While the adsorptive substance will usually be a single substance or at least comprise substances of the same type, the present invention also contemplates the use of two or more different types of adsorptive substances. For example, a mixture of two or more different low molecular weight compounds or a mixture of two or more different polymers may be used, as well as a mixture of one or more low molecular weight compounds and one or more polymers. The terms "substance that is capable of being adsorbed on the nanoparticles" and "adsorptive substance" as used herein include all of these possibilities. One of skill in the art will understand that other (volatile) components of the mixture such as, e.g., the polyol and/or solvent may also have a tendency of being adsorbed on the nanoparticle surface, but without substantially preventing the agglomeration of the nanoparticles. Such substances do not qualify as "adsorptive substance" within the meaning of this term as used herein.

A preferred and non-limiting example of an adsorptive substance for use in the process of the present invention includes a substance that is capable of electronically interacting with a metal atom of a nanoparticle. Usually, a substance that is capable of this type of interaction will comprise one or more atoms (e.g., at least two atoms) with one or more free electron pairs such as, e.g., oxygen, nitrogen and sulfur. By way of non-limiting example, the adsorptive substance may be capable of a dative interaction with a metal atom on the surface of a nanoparticle and/or of chelating the metal atom. Particularly preferred adsorptive substances comprise one or two O and/or N atoms. The atoms with a free electron pair will usually be present in the substance in the form of a functional group such as, e.g., a hydroxy group, a carbonyl group, an ether group and an amino group, or as a constituent of a functional group that comprises one or more of these groups as a structural element thereof. Non-limiting examples of suitable functional groups include —COO—, —O—CO—O—, —CO—O—CO—, —C—O—C—, —CONR—, —NR—CO—O—, —NR$^1$—CO—NR$^2$—, —CO—NR—CO—, —SO$_2$—NR— and —SO$_2$—O—, wherein R, R$^1$ and R$^2$ each independently represent hydrogen or an organic radical (e.g., an aliphatic or aromatic, unsubstituted or substituted radical comprising from about 1 to about 20 carbon atoms).

Such functional groups may comprise the above (and other) structural elements as part of a cyclic structure (e.g., in the form of a cyclic ester, amide, anhydride, imide, carbonate, urethane, urea, and the like).

In one aspect of the process of the present invention, the adsorptive substance is or comprises a substance that is capable of reducing the metal compound, i.e., in addition to the reduction by the polyol used. A specific, non-limiting example of such a substance is polyvinylpyrrolidone (PVP).

The adsorptive substance may comprise a low molecular weight compound, preferably a low molecular weight organic compound, e.g., a compound having a molecular weight of not higher than about 500, more preferably not higher than about 300, and/or may comprise an oligomeric or polymeric compound having a (weight average) molecular weight (in Daltons) of at least about 1,000, for example, at least about 3,000, at least about 5,000, or at least about 8,000, but preferably not higher than about 500,000, e.g., not higher than about 200,000, or not higher than about 100,000. Too high a molecular weight may give rise to an undesirably high viscosity of the solution at a desirable concentration of the adsorptive substance and/or may cause flocculation. Also, the most desirable molecular weight may be dependent on the metal. By way of non-limiting example, in the case of polyvinylpyrrolidone, a particularly preferred weight average molecular weight is in the range of from about 3,000 to about 60,000, in particular if the metal comprises silver.

In general, it is preferred for the adsorptive substance to have a total of at least about 10 atoms per molecule which are selected from C, N and O, e.g., at least about 20 such atoms or at least about 50 such atoms. More preferably, the adsorptive substance has a total of at least about 100 C, N and O atoms per molecule, e.g., at least about 200, at least about 300, or at least about 400 C, N and O atoms per molecule. In the case of polymers these numbers refer to the average per polymer molecule.

Non-limiting examples of the low molecular weight adsorptive substance for use in the present invention include fatty acids, in particular, fatty acids having at least about 8 carbon atoms. Non-limiting examples of oligomers/polymers for use as the adsorptive substance in the process of the present invention include homo- and copolymers (including polymers such as, e.g., random copolymers, block copolymers and graft copolymers) which comprise units of at least one monomer which comprises one or more O atoms and/or one or more N atoms. A non-limiting class of preferred polymers for use in the present invention is constituted by polymers which comprise at least one monomer unit which includes at least two atoms which are selected from O and N atoms. Corresponding monomer units may, for example, comprise at least one hydroxyl group, carbonyl group, ether linkage and/or amino group and/or one or more structural elements of formula —COO—, —O—CO—O—, —CO—O—CO—, —C—O—C—, —CONR—, —NR—CO—O—, —NR$^1$—CO—NR$^2$—, —CO—NR—CO—, —SO$_2$—NR— and —SO$_2$—O—, wherein R, R$^1$ and R$^2$ each independently represent hydrogen or an organic radical (e.g., an aliphatic or aromatic, unsubstituted or substituted radical comprising from about 1 to about 20 carbon atoms).

Non-limiting examples of corresponding polymers include polymers which comprise one or more units derived from the following groups of monomers:

(a) monoethylenically unsaturated carboxylic acids of from about 3 to about 8 carbon atoms and salts thereof. This group of monomers includes, for example, acrylic acid, methacrylic acid, dimethylacrylic acid, ethacrylic acid, maleic acid, citraconic acid, methylenemalonic acid, allylacetic acid, vinylacetic acid, crotonic acid, fumaric acid, mesaconic acid and itaconic acid. The monomers of group (a) can be used either in the form of the free carboxylic acids or in partially or completely neutralized form. For the neutralization alkali metal bases, alkaline earth metal bases, ammonia or amines, e.g., sodium hydroxide, potassium hydroxide, sodium carbonate, potassium carbonate, sodium bicarbonate, magnesium oxide, calcium hydroxide, calcium oxide, ammonia, triethylamine, methanolamine, diethanolamine, triethanolamine, morpholine, diethylenetriamine or tetraethylenepentamine may, for example, be used;

(b) the esters, amides, anhydrides and nitriles of the carboxylic acids stated under (a) such as, e.g., methyl acrylate, ethyl acrylate, methyl methacrylate, ethyl methacrylate, n-butyl acrylate, hydroxyethyl acrylate, 2- or 3-hydroxypropyl acrylate, 2- or 4-hydroxybutyl acrylate, hydroxyethyl methacrylate, 2- or 3-hydroxypropyl methacrylate, hydroxyisobutyl acrylate, hydroxyisobutyl methacrylate, monomethyl maleate, dimethyl maleate, monoethyl maleate, diethyl maleate, maleic anhydride, 2-ethylhexyl acrylate, 2-ethylhexyl methacrylate, acrylamide, methacrylamide, N,N-dimethylacrylamide, N-tert-butylacrylamide, acrylonitrile, methacrylonitrile, 2-dimethylaminoethyl acrylate, 2-dimethylaminoethyl methacrylate, 2-diethylaminoethyl acrylate, 2-diethylaminoethyl methacrylate and the salts of the last-mentioned monomers with carboxylic acids or mineral acids and the quaternized products;

(c) acrylamidoglycolic acid, vinylsulfonic acid, allylsulfonic acid, methallylsulfonic acid, styrenesulfonic acid, 3-sulfopropyl acrylate, 3-sulfopropyl methacrylate and acrylamidomethylpropanesulfonic acid and monomers containing phosphonic acid groups, such as, e.g., vinyl phosphate, allyl phosphate and acrylamidomethylpropanephosphonic acid; and esters, amides and anhydrides of these acids;

(d) N-vinyllactams such as, e.g., N-vinylpyrrolidone, N-vinyl-2-piperidone and N-vinylcaprolactam;

(e) vinyl acetal, vinyl butyral, vinyl alcohol and ethers and esters thereof (such as, e.g., vinyl acetate, vinyl propionate and methylvinylether), allyl alcohol and ethers and esters thereof, N-vinylimidazole, N-vinyl-2-methylimidazoline, and the hydroxystyrenes.

Corresponding polymers may also contain additional monomer units, for example, units derived from monomers without functional group, halogenated monomers, aromatic monomers etc. Non-limiting examples of such monomers include olefins such as, e.g., ethylene, propylene, the butenes, pentenes, hexenes, octenes, decenes and dodecenes, styrene, vinyl chloride, vinylidene chloride, tetrafluoroethylene, etc. Further, the polymers for use as adsorptive substance in the process of the present invention are not limited to addition polymers, but also comprise other types of polymers, for example, condensation polymers such as, e.g., polyesters, polyamides, polyurethanes and polyethers, as well as polysaccharides such as, e.g., starch, cellulose and derivatives thereof, etc.

Other non-limiting examples of polymers which are suitable for use as adsorptive substance in the present invention are disclosed in e.g., U.S. Patent Application Publication 2004/0182533 A1, the entire disclosure whereof is expressly incorporated by reference herein.

Preferred polymers for use as adsorptive substance in the present invention include those which comprise units derived from one or more N-vinylcarboxamides of formula (I)

$$CH_2=CH-NR^3-CO-R^4 \qquad (I)$$

wherein $R^3$ and $R^4$ independently represent hydrogen, optionally substituted alkyl (including cycloalkyl) and optionally substituted aryl (including alkaryl and aralkyl) or heteroaryl (e.g., $C_{6-20}$ aryl such as phenyl, benzyl, tolyl and phenethyl, and $C_{4-20}$ heteroaryl such as pyrrolyl, furyl, thienyl and pyridinyl).

$R^3$ and $R^4$ may, e.g., independently represent hydrogen or $C_{1-12}$ alkyl, particularly $C_{1-6}$ alkyl such as methyl and ethyl. $R^3$ and $R^4$ together may also form a straight or branched chain containing from about 2 to about 8, preferably from about 3 to about 6, particularly preferably from about 3 to about 5 carbon atoms, which chain links the N atom and the C atom to which $R^3$ and $R^4$ are bound to form a ring which preferably has about 4 to about 8 ring members. Optionally, one or more carbon atoms may be replaced by heteroatoms such as, e.g., oxygen, nitrogen or sulfur. Also optionally, the ring may contain a carbon-carbon double bond.

Non-limiting specific examples of $R^3$ and $R^4$ are methyl, ethyl, isopropyl, n-propyl, n-butyl, isobutyl, sec-butyl, tert-butyl, n-hexyl, n-heptyl, 2-ethylhexyl, n-octyl, n-decyl, n-undecyl, n-dodecyl, n-tetradecyl, n-hexadecyl, n-octadecyl and n-eicosyl. Non-limiting specific examples of $R^3$ and $R^4$ which together form a chain are 1,2-ethylene, 1,2-propylene, 1,3-propylene, 2-methyl-1,3-propylene, 2-ethyl-1,3-propylene, 1,4-butylene, 1,5-pentylene, 2-methyl-1,5-pentylene, 1,6-hexylene and 3-oxa-1,5-pentylene.

Non-limiting specific examples of N-vinylcarboxamides of formula (I) are N-vinylformamide, N-vinylacetamide, N-vinylpropionamide, N-vinylbutyramide, N-vinylisobutyramide, N-vinyl-2-ethylhexanamide, N-vinyldecanamide, N-vinyldodecanamide, N-vinylstearamide, N-methyl-N-vinylformamide, N-methyl-N-vinylacetamide, N-methyl-N-vinylpropionamide, N-methyl-N-vinylbutyramide, N-methyl-N-vinylisobutyramide, N-methyl-N-vinyl-2-ethylhexanamide, N-methyl-N-vinyldecanamide, N-methyl-N-vinyldodecanamide, N-methyl-N-vinylstearamide, N-ethyl-N-vinylformamide, N-ethyl-N-vinylacetamide, N-ethyl-N-vinylpropionamide, N-ethyl-N-vinylbutyramide, N-ethyl-N-vinylisobutyramide, N-ethyl-N-vinyl-2-ethylhexanamide, N-ethyl-N-vinyldecanamide, N-ethyl-N-vinyldodecanamide, N-ethyl-N-vinylstearamide, N-isopropyl-N-vinylformamide, N-isopropyl-N-vinylacetamide, N-isopropyl-N-vinylpropionamide, N-isopropyl-N-vinylbutyramide, N-isopropyl-N-vinylisobutyramide, N-isopropyl-N-vinyl-2-ethylhexanamide, N-isopropyl-N-vinyldecanamide, N-isopropyl-N-vinyldodecanamide, N-isopropyl-N-vinylstearamide, N-n-butyl-N-vinylformamide, N-n-butyl-N-vinylacetamide, N-n-butyl-N-vinylpropionamide, N-n-butyl-N-vinylbutyramide, N-n-butyl-N-vinylisobutyramide, N-n-butyl-N-vinyl-2-ethylhexanamide, N-n-butyl-N-vinyldecanamide, N-n-butyl-N-vinyldodecanamide, N-n-butyl-N-vinylstearamide, N-vinylpyrrolidone, N-vinyl-2-piperidone and N-vinylcaprolactam.

Particularly preferred polymers for use in the present invention include polymers which comprise monomer units of one or more unsubstituted or substituted N-vinyllactams, preferably those having from about 4 to about 8 ring members such as, e.g., N-vinylcaprolactam, N-vinyl-2-piperidone and N-vinylpyrrolidone. These polymers include homo- and copolymers. In the case of copolymers (including, for example, random, block and graft copolymers), the N-vinyllactam (e.g., N-vinylpyrrolidone) units are preferably present in an amount of at least about 10 mole-%, e.g., at least about 30 mole-%, at least about 50 mole-%, at least about 70 mole-%, at least about 80 mole-%, or at least about 90 mole-%. By way of non-limiting example, the comonomers may comprise one or more of those mentioned in the preceding paragraphs, including monomers without functional group (e.g., ethylene, propylene, styrene, etc.), halogenated monomers, etc.

If the vinyllactam (e.g., vinylpyrrolidone) monomers (or at least a part thereof) carry any one or more substituents on the heterocyclic ring, non-limiting examples of such substituents include alkyl groups (for example, alkyl groups having from 1 to about 12 carbon atoms, e.g., from 1 to about 6 carbon atoms such as, e.g., methyl, ethyl, propyl and butyl), alkoxy groups (for example, alkoxy groups having from 1 to about 12 carbon atoms, e.g., from 1 to about 6 carbon atoms such as, e.g., methoxy, ethoxy, propoxy and butoxy), halogen atoms (e.g., F, Cl and Br), hydroxy, carboxy and amino groups (e.g., dialkylamino groups such as dimethylamino and diethylamino) and any combinations of these substituents.

Non-limiting specific examples of vinyllactam polymers for use in the present invention include homo- and copolymers of vinylpyrrolidone which are commercially available from, e.g., International Specialty Products (www.ispcorp.com). In particular, these polymers include (a) vinylpyrrolidone homopolymers such as, e.g., grades K-15 and K-30 with K-value ranges of from 13-19 and 26-35, respectively, corresponding to average molecular weights (determined by GPC/MALLS) of about 10,000 and about 67,000;

(b) alkylated polyvinylpyrrolidones such as, e.g., those commercially available under the trade mark GANEX® which are vinylpyrrolidone-alpha-olefin copolymers that contain most of the alpha-olefin (e.g., about 80% and more) grafted onto the pyrrolidone ring, mainly in the 3-position thereof; the alpha-olefins may comprise those having from about 4 to about 30 carbon atoms; the alpha-olefin content of these copolymers may, for example, be from about 10% to about 80% by weight;

(c) vinylpyrrolidone-vinylacetate copolymers such as, e.g., random copolymers produced by a free-radical polymerization of the monomers in a molar ratio of from about 70/30 to about 30/70 and having weight average molecular weights of from about 14,000 to about 58,000;

(d) vinylpyrrolidone-dimethylaminoethylmethacrylate copolymers;

(e) vinylpyrrolidone-methacrylamidopropyl trimethylammonium chloride copolymers such as, e.g., those commercially available under the trade mark GAFQUAT®;

(f) vinylpyrrolidone-vinylcaprolactam-dimethylaminoethylmethacrylate terpolymers such as, e.g., those commercially available under the trade mark GAFFIX®;

(g) vinylpyrrolidone-styrene copolymers such as, e.g., those commercially available under the trade mark POLECTRON®; a specific example thereof is a graft emulsion copolymer of about 70% vinylpyrrolidone and about 30% styrene polymerized in the presence of an anionic surfactant;

(h) vinylpyrrolidone-acrylic acid copolymers such as, e.g., those commercially available under the trade mark ACRYLIDONE® which are produced in the molecular weight range of from about 80,000 to about 250,000.

Combining of Metal Compound with Other Components

In the process of the present invention the metal compound may be combined with the polyol in any manner that allows an intimate contact between these two reactants. In a preferred aspect, the metal compound is combined with a solution which consists of or at least comprises the polyol and the adsorptive substance. The reaction between the metal compound and the polyol will usually be carried out at elevated temperatures, e.g., at least about 80° C., and preferably even higher, depending on the metal compound and the polyol employed. The metal compound may be employed in the form of a solid material, a suspension, a solution (preferably in a polyol), etc. A preferred process for making nanoparticles by combining a metal compound with a polyol is described in U.S. Provisional Application Ser. No. 60/643,578 entitled "Production of Metal Nanoparticles," the entire disclosure whereof is expressly incorporated by reference herein.

Volume of Reaction Mixture

The volume of the reaction mixture from which the metal nanoparticles are separated by the process of the present invention is not particularly limited. However, with increasing amounts of the employed metal compound it will become increasingly desirable to keep the total volume of the reaction mixture small so as to keep the volume of the reaction mixture and, thus the required size of the reaction vessel as small as possible and also to keep the amount of liquids that need to be discarded/recycled after the reaction is completed at a minimum. Accordingly, provided the solubility of the metal compound in the selected liquid components of the reaction mixture is high enough, the combined volume of the reaction mixture per one mole of employed metal compound will usually be not larger than about 10 liters, e.g., not larger than about 8 liters, not larger than about 6 liters, not larger than about 5 liters, or not larger than about 4 liters. On the other hand, for reasons of, inter alia, solubility, the combined volume will usually be not smaller than about 1 liters, e.g., not smaller than about 2 liters, or not smaller than about 3 liters per one mole of employed metal compound. The amount of polyol and, optionally, of any other solvent that is used for carrying out the reaction will depend on a number of factors such as, e.g., the types of metal compound and adsorptive substance and the solubilities thereof in the particular liquid medium, etc. Accordingly, a (considerably) smaller or larger volume of the reaction mixture than the volumes indicated herein may sometimes be more advantageous and/or desirable.

Ratio of Metal Compound and Adsorptive Substance

The most desirable ratio of the metal compound and the adsorptive substance is a function of a variety of factors. In this regard, it is to be appreciated that the adsorptive substance will generally have multiple functions. These functions include, of course, a substantial prevention of an agglomeration of the nanoparticles and, as a result thereof, facilitating an isolation of the nanoparticles from the reaction mixture, ensuring a substantial redispersibility of the isolated nanoparticles and a stabilization of dispersions comprising these nanoparticles. Another function of the adsorptive substance usually comprises assisting in the control of the size and shape of nanoparticles during the reduction of the metal compound. Also, under otherwise identical conditions, the average size of the formed nanoparticles will usually decrease with increasing molar ratio of adsorptive substance and metal compound. At any rate, the adsorptive substance should be present in at least the amount that is sufficient to substantially prevent an agglomeration of the nanoparticles. This amount is at least in part dependent on the size of the metal cores of the formed nanoparticles.

If the adsorptive substance is or comprises a low molecular weight compound (i.e., one or more low molecular weight compounds, collectively referred to herein as a single compound), the molar ratio of the low molecular weight compound and the metal in the reaction mixture will often be at least about 3:1, e.g., at least about 5:1, or at least about 10:1. While there is no particular upper limit for this ratio, for practical reasons and reasons of economic efficiency one will usually avoid a substantially higher amount of adsorptive substance than the amount that is needed for obtaining particles in the desired size range and/or for substantially preventing an agglomeration of the nanoparticles.

If the adsorptive substance is or comprises a polymer (i.e., one or more polymers, collectively referred to herein as a single polymer), the molar ratio in the reaction mixture of the monomer units of the polymer (and preferably of only those monomer units that are capable of being adsorbed on the nanoparticles), and the metal will often be at least about 3:1, e.g., at least about 5:1, at least about 6:1, at least about 8:1, or at least about 10:1. However, for practical reasons (in particular in view of the viscosity increasing effect of certain polymers) and for reasons of economic efficiency (excess adsorptive substance, i.e., substance that will not be adsorbed may have to be removed and discarded/recycled later) this ratio will usually be not higher than about 100:1, e.g., not higher than about 80:1, not higher than about 50:1, not higher than about 30:1, or not higher than about 20:1.

Nanoparticle-Precipitating Liquid

According to the process of the present invention, the separation of the formed nanoparticles from the liquid phase of the reaction mixture comprises the addition of a nanoparticle-precipitating liquid to the reaction mixture. The nanoparticle-precipitating liquid may comprise a single substance or a mixture of two or more substances. The suitability of a substance for causing a precipitation of the nanoparticles will usually depend, inter alia, on the nature of the substance that is adsorbed on the surface of the nanoparticles. A non-limiting example of a nanoparticle-precipitating substance includes a substance that interferes with the (electronic and/or steric) interaction between the adsorptive substance that is adsorbed on the surface of the nanoparticles and one or more components of the liquid phase, thereby causing a precipitation of the nanoparticles. A preferred and non-limiting example of such a nanoparticle-precipitating substance is a solvent in which the adsorptive substance is substantially insoluble or only poorly soluble.

The nanoparticle-precipitating substance is preferably substantially soluble in and/or miscible with the liquid phase of the reaction mixture, in particular, the polyol(s). Often this substance will comprise an aprotic solvent, preferably a polar aprotic solvent. The term "aprotic" characterizes a solvent that is not capable of releasing (dissociating into) protons. Non-limiting examples of such solvents include ethers (e.g., diethyl ether, tetrahydrofuran, tetrahydropyran, etc.), sulfonyl compounds and particularly, carbonyl compounds such as, e.g., ketones, esters and amides, especially ketones. Preferred ketones comprise from 3 to about 8 carbon atoms such as, e.g., acetone, butanone, the pentanones, the hexanones, cyclopentanone and cyclohexanone. Of course, mixtures of aprotic solvents may be used as well.

The nanoparticle-precipitating substance(s) will usually be employed in an amount which is sufficient to cause a precipitation of at least a substantial portion of the nanoparticles that are present in the reaction mixture, e.g., at least about 90%, at least about 95%, or at least about 98% of the nanoparticles.

Protic Solvent

While the addition of a nanoparticle-precipitating substance in a sufficient quantity may result in a precipitation, the precipitation will frequently be unsatisfactory, particularly in cases where the volume of the liquid phase of the reaction mixture is substantial (e.g., at least about 1 liter, at least about 2 liters, or at least about 3 liters) and/or the concentration of the adsorptive substance and/or the nanoparticles in the liquid phase is relatively high. For example, the addition of the nanoparticle-precipitating substance in a sufficient quantity to cause a precipitation of substantially all of the nanoparticles may frequently cause a concomitant precipitation of at least a substantial portion of the excess (unbound) adsorptive substance that is present in the reaction mixture. The precipitated adsorptive substance may form an oil which prevents or at least significantly interferes with (slows down) a settling of the nanoparticles, thereby making the separation of the nanoparticles from the liquid phase difficult, if not impossible.

According to the present invention it has been found that that the required settling times can be shortened and/or the formation of oily precipitates can be significantly reduced or completely eliminated if before and/or during and/or after the addition of the nanoparticle-precipitating substance a solvent a protic solvent is added to the reaction mixture. The term "protic" characterizes a solvent that is capable of releasing (dissociating into) protons. Preferably, the protic solvent comprises a hydroxyl-containing compound, in particular, an alcohol such as, e.g., ethanol, propanol, butanol and the like, and/or a polyol, e.g., any of the polyols that may be used as a reactant in the process of the present invention. Water may also be used as the (or a part of the) protic solvent. Preferably, the protic solvent is or comprises one or more of the polyols that are present in the reaction mixture.

The protic solvent will usually be a solvent in which the adsorptive substance readily dissolves. In a preferred aspect of the process of the present invention, the protic solvent comprises a glycol such as, e.g., ethylene glycol and/or propylene glycol.

Addition of Nanoparticle-Precipitating Liquid and Protic Solvent

The nanoparticle-precipitating liquid and the protic solvent can be added to the reaction mixture in any order. By way of non-limiting example, the nanoparticle-precipitating liquid may be added to the reaction mixture, followed by the protic solvent, or the protic solvent may be added before the nanoparticle-precipitating liquid is added to the reaction mixture. It is also possible to add portions of the nanoparticle-precipitating liquid and the protic solvent in an alternating manner. In some instances it may prove particularly advantageous if a portion of the protic solvent is added to the reaction mixture already during the reaction or at the latest before the addition of the particle-precipitating liquid to the reaction mixture. This portion of the protic solvent will often be at least about 10%, e.g., at least about 15%, or at least about 20%, but usually not more than about 50%, e.g., not more than about 40%, or not more than about 30% of the total amount of protic solvent employed.

The most advantageous volume ratio of the nanoparticle-precipitating liquid and the protic solvent is dependent on a number of factors, inter alia, the composition of the reaction mixture, the solubility of the adsorptive substance, the size and density of the nanoparticles and the specific type and composition of the nanoparticle-precipitating liquid and the protic solvent employed. One of ordinary skill in the art will also appreciate that it is also important that the impurities that are present in the reaction mixture (e.g., by-products of the reaction, excess adsorptive substance) are removed. The volume ratio of the nanoparticle-precipitating liquid and the protic solvent is preferably be such that the excess adsorptive substance is dissolved and at the same time the nanoparticles are not stably dispersed in the liquid phase. At any rate, in many cases the volume ratio of the nanoparticle-precipitating liquid and the protic solvent will be not smaller than about 8:1, e.g., not smaller than about 9:1, or not smaller than about 10:1. On the other hand, it will usually not be larger than about 20:1, e.g., not larger than about 15:1.

It is particularly advantageous according to the present invention for the precipitation of the nanoparticles to be accompanied by an agitation of the reaction mixture at least during (and preferably for at least some time after) the addition of the nanoparticle-precipitating liquid. An agitation of the reaction mixture can be accomplished by any suitable means such as, e.g., stirring, shaking, sonication and any combination of two or more thereof.

Optional Further Processing

According to a preferred aspect of the process of the present invention, the precipitated nanoparticles are isolated by removing the liquid phase of the reaction mixture therefrom. Any process that is suitable for removing a liquid from a solid can be used for this purpose. Non-limiting examples of such a process include decantation, filtration, centrifugation and any combinations thereof. Preferably, the nanoparticles are isolated by centrifugation (including, for example, continuous centrifugation), filtration (including ultrafiltration, diafiltration etc.) or a combination of two or more of these processes.

With respect to continuous centrifugation, this can be accomplished in different ways. For example, one may use a unit (centrifuge) which is optimized for affording at least three different products in different sections of the unit, for example, a supernatant in a top section, undesirably large particles in a bottom section and desired product (e.g., nanoparticles in the desired particle size range) in a middle section. Each of these three products may be withdrawn continuously from the centrifuge while a fresh mixture for separation is continuously introduced into the centrifuge. According to another alternative of the continuous centrifugation, two or more centrifuges may be arranged in series, each of them being optimized for the removal of one kind of separation product, e.g., supernatant, undersized particles, particles in the desired particle size range, oversized particles, etc.

Regarding the ultrafiltration/diafiltration of nanoparticles reference may be made, for example, to U.S. Pat. Nos. 6,328, 894, 5,879,715, 6,245,494 and 6,811,885, the entire disclosures whereof are incorporated by reference herein. Briefly, ultrafiltration and diafiltration use a filtration under pressure through a membrane which allows only components of a certain maximum size to pass therethrough. In the present case, the metal nanoparticles will be retained by the membrane while preferably a major part or substantially all of the contaminants (e.g., dissolved inorganic matter, excess adsorptive substance, etc.) and the like will be able to pass through the membrane. Any size of membrane as well as any channel (pore) size thereof can be used as long as the process permits a preferably substantial removal of contaminants and the like while retaining substantially all of the nanoparticles. In a preferred aspect, the membrane may vibrate to substantially reduce clogging and/or to permit a higher permeate flow rate. Also, the ultrafiltration/diafiltration may be pressure-driven (i.e., involving pressing through the membrane) or vacuum-driven (i.e., involving sucking through the membrane). Membrane configurations include, but are not limited to, flat sheet membranes, cross flow membranes, spiral wound tubes, or hollow fiber tubes. For example, a three compartment through-flow cell comprising two membranes may be used. Non-limiting examples of membrane materials include polymeric and ceramic materials such as, e.g., polysulfone, polyethersulfone, sulfonated polysulfone, polyamide, cellulose acetate, and metal oxides such as the oxides of titanium, zirconium, silicon, aluminum and combinations of two or more thereof. By way of non-limiting example, the membrane may have a molecular weight cutoff (MWCO) in the range of from about 10,000 to about 1,000,000, e.g., about 50,000, about 100,000, about 200,000 or about 500,000, and/or a pore size of from about 0.01 µm to about 1 µm (preferably at least about 0.02 µm and not higher than about 0.5 µm) and/or a lumen of from about 0.1 mm to about 5 mm (preferably at least about 2 mm and not more than about 3 mm).

Any type of ultrafiltration/diafiltration process may be used as long as the process is capable of removing a substantial portion of the contaminants and the like (e.g., at least about 70%, at least about 80%, at least about 90%, or at least about 95%) and in particular, that part of the adsorptive substance that is not adsorbed on the surface of the nanoparticles while retaining substantially all of the nanoparticles. By way of non-limiting example, a cross-flow separation process may be used.

The nanoparticles that have been separated from the liquid phase are preferably subjected to a washing operation to remove at least a substantial portion of the impurities that may still be associated therewith such as, e.g., materials that are not adsorbed on the surface of the nanoparticles to any significant extent. For example, these impurities may include inorganic salts formed during the reduction of the metal compound, residual solvent(s) from the precipitation step and excess adsorptive substance, i.e., adsorptive substance that is merely present as an impurity without being adsorbed on the nanoparticles. The washing liquid used for the washing operation preferably is or comprises a solvent that is capable of dissolving the impurities associated with the nanoparticles, in particular, excess adsorptive substance. By way of non-limiting example, the washing liquid may comprise a protic organic solvent such as, e.g., a hydroxyl-containing compound, preferably, an alcohol and/or a polyol and/or water. Illustrative and non-limiting examples of alcohols and polyols that may be used for the washing operation include aliphatic alcohols having from 1 to about 12 carbon atoms such as, e.g., methanol, ethanol, propanol, isopropanol, butanol, pentanol, cyclopentanol, hexanol, cyclohexanol, octanol, decanol, dodecanol and the like, and polyols having from 1 to about 4 hydroxyl groups and from 2 to about 12 carbon atoms such as, e.g., ethylene glycol, propylene glycol, glycerol and the like. A preferred solvent for use in the washing operation includes ethanol, which may be used alone or in combination with other solvents (e.g., water).

The washing operation may, for example, be carried out by dispersing the isolated crude nanoparticles obtained after, for example, a filtration (including, e.g., a diafiltration/ultrafiltration) and/or centrifugation of the reaction mixture in the washing liquid, followed by a separation of the washed/purified nanoparticles by, e.g., filtration and/or centrifugation. This process may optionally be repeated one or more times. The washed (purified) nanoparticles may thereafter be dried (e.g., under reduced pressure and/or at a temperature that does not adversely affect the adsorptive substance to any significant extent) and thereafter stored and/or shipped. Even after storage for extended periods the dry particles can be redispersed in a desired liquid to form a dispersion (e.g., a printing ink) that is substantially stable over several days or even weeks.

Preferred Aspects

A preferred aspect of the process of the present invention is represented by the production of silver nanoparticles wherein the nanoparticles are formed by combining a silver compound with a solution that comprises a glycol and a vinyl pyrrolidone polymer, followed by a precipitation of formed nanoparticles by the addition to the resultant reaction mixture of an aprotic nanoparticle-precipitating liquid in a sufficient amount to precipitate at least a substantial portion of the nanoparticles and of a protic solvent which comprises an alcohol and/or a polyol in a sufficient amount to improve the separation of the nanoparticles from the liquid phase.

Non-limiting examples of silver compounds for use in the preferred aspect of the process of the present invention include silver nitrate, silver acetate, silver trifluoroacetate and silver oxide. Particularly preferred is silver nitrate. Preferably the silver compound comprises a single silver compound, although mixtures of different silver compounds and mixtures of one or more silver compounds with one or more compounds of different metals may be used as well.

The glycol(s) used in combination with the silver compound will usually have from 2 to about 4 hydroxy groups and/or from 2 to about 6 carbon atoms. Non-limiting examples of such glycols include ethylene glycol, diethylene glycol, triethylene glycol, propylene glycol, dipropylene glycol, 1,3-propanediol, 1,2-butanediol, 1,3-butanediol, 1,4-butanediol, 2,3-butanediol, glycerol and trimethylolpropane. Preferred examples of the glycols include ethylene glycol and propylene glycol. Particularly preferred is ethylene glycol.

The vinyl pyrrolidone polymer for use in combination with the silver compound and the polyol may be a vinyl pyrrolidone homopolymer and/or a vinyl pyrrolidone copolymer. Preferably it is or at least comprises a vinyl pyrrolidone homopolymer (PVP).

The vinyl pyrrolidone polymer (and particularly, the vinyl pyrrolidone homopolymer) will usually have a weight average molecular weight of up to about 100,000, e.g., up to about 60,000, up to about 50,000, up to about 40,000, or up to about 30,000, and preferably, of not less than about 3,000, e.g., not less than about 4,000, not less than about 5,000, or not less than about 8,000. A particularly preferred (weight) average molecular weight of the vinyl pyrrolidone (homo)polymer is about 10,000.

The molar ratio of vinyl pyrrolidone units of the polymer and the silver compound is preferably at least about 5:1, e.g., at least about 8:1, or at least about 10:1.

The volume of the reaction mixture in this particularly preferred aspect of the process of the present invention will usually be not larger than about 6 liters per one mole of the silver compound, e.g., not larger than about 5 liters per mole of the silver compound, or not larger than about 4 liters per mole of the silver compound.

The nanoparticle-precipitating liquid preferably is or comprises a liquid that is miscible with the glycol. Non-limiting examples of preferred nanoparticle-preciptitating liquids include aprotic carbonyl compounds, in particular, (preferably aliphatic) ketones such as, e.g., acetone.

The protic solvent preferably is or comprises a glycol, in particular, ethylene glycol and/or propylene glycol. It is particularly preferred for the protic solvent to be or comprise the glycol or one of the glycols that is/are present in the reaction mixture.

In another preferred aspect, substantially the entire protic solvent may be added before the addition of the nanoparticle-precipitating liquid and/or at least the addition of the nanoparticle-precipitating liquid is carried out with agitation of the reaction mixture.

The present invention will be further illustrated by the following non-limiting examples.

EXAMPLE 1

In a mixing tank a solution of 1000 g of PVP (M.W. 10,000, Aldrich) in 2.5 L of ethylene glycol is prepared and heated to 120° C. In a second mixing tank, 125 g of silver nitrate is dissolved in 500 ml of ethylene glycol at 25° C. These two solutions are rapidly combined (within about 5 seconds) in a reactor, in which the combined solutions (immediately after combination at a temperature of about 114° C.) are stirred at 120° C. for about 1 hour. The resultant reaction mixture is allowed to cool to room temperature and about 0.25 L of ethylene glycol is added thereto to replace evaporated ethylene glycol. This mixture is stirred at high speed for about 30 minutes to resuspend any particles that have settled during the reaction. The resultant mixture is transferred to a mixing tank where 12 L of acetone and about 1 L of ethylene glycol are added. The resultant mixture is stirred thoroughly and then transferred to a centrifuge where it is centrifuged for about 20 minutes at 1,500 g to separate the silver nanoparticles from the liquid phase. This affords 70 g of nanoparticles which have PVP adsorbed thereon. The particles are subsequently suspended in 2,000 ml of ethanol and centrifuged to remove, inter alia, excess PVP, i.e., PVP that is not adsorbed on the nanoparticles but is present merely as a contaminant. The resultant filter cake of nanoparticles is dried in a vacuum oven at about 35° C. and about $10^{-2}$ torr to afford dry nanoparticles. These nanoparticles exhibit a PVP content of about 4 to about 8 weight percent, depending on the time the nanoparticles have been in contact with the ethanol. ICP (inductively coupled plasma) data indicates that the longer the particles are in contact with the ethanol, the more of the acetone and ethylene glycol present in the PVP matrix is displaced by ethanol, resulting in particles with an increasingly higher silver content.

EXAMPLE 2

To 4 L of a particle suspension composed of 1.0 kg of unbound PVP, 3 L of ethylene glycol and about 71 g of silver nanoparticles having PVP adsorbed thereon (prepared according to a process similar to that described in Example 1) is added 12 L of acetone. The resultant mixture is subjected to centrifugation at 1,500 g. An oil suspension is formed during centrifugation. The particle oil suspension is difficult to break and complete separation of the particles from the liquid phase cannot be accomplished.

EXAMPLE 3

Example 2 is repeated, except that 1.25 L of ethylene glycol is added before carrying out the centrifugation. The extra ethylene glycol prevents the formation of an oil. The particles form a cake and complete separation of the particles from the liquid phase can be accomplished.

It is noted that the foregoing examples have been provided merely for the purpose of explanation and are in no way to be construed as limiting of the present invention. While the present invention has been described with reference to an exemplary embodiment, it is understood that the words that have been used are words of description and illustration, rather than words of limitation. Changes may be made, within the purview of the appended claims, as presently stated and as amended, without departing from the scope and spirit of the present invention in its aspects. Although the invention has been described herein with reference to particular means, materials and embodiments, the invention is not intended to be limited to the particulars disclosed herein. Instead, the invention extends to all functionally equivalent structures, methods and uses, such as are within the scope of the appended claims.

What is claimed is:

1. A process for the production of metal nanoparticles, wherein the process comprises:
   (a) forming the nanoparticles by combining a metal compound with a solution that comprises a polyol and a substance that is capable of being adsorbed on the nanoparticles to form a resultant mixture,
   (b) cooling the resultant mixture after step (a), and
   (c) precipitating formed nanoparticles after step (b) by an addition to the resultant mixture of a nanoparticle-precipitating liquid in a sufficient amount to precipitate at least a substantial portion of the nanoparticles, and of a protic solvent in a sufficient amount to improve separation of the nanoparticles from a liquid phase.

2. The process of claim 1, wherein the protic solvent accelerates a separation of the nanoparticles.

3. The process of claim 1, wherein the protic solvent reduces or substantially eliminates a separation of oily matter.

4. The process of claim 1, wherein the metal comprises a transition metal.

5. The process of claim 1, wherein the metal comprises at least one of gold, silver, copper, nickel, cobalt, palladium, platinum, iridium, osmium, rhodium, ruthenium, rhenium, vanadium, chromium, manganese, niobium, molybdenum, tungsten, tantalum, iron and cadmium.

6. The process of claim 1, wherein the metal comprises silver.

7. The process of claim 1, wherein the metal compound comprises at least one of silver nitrate, silver acetate, silver trifluoroacetate, silver oxide, copper oxide, copper hydroxide, copper sulfate, nickel oxide, nickel hydroxide, nickel chloride, nickel sulfate, nickel acetate, cobalt oxide, cobalt hydroxide, cobalt chloride and cobalt sulfate.

8. The process of claim 1, wherein the polyol comprises a polyol having from about 2 to about 6 hydroxy groups.

9. The process of claim 1, wherein the polyol comprises at least one glycol.

10. The process of claim 9, wherein the at least one glycol comprises from 2 to about 4 carbon atoms.

11. The process of claim 1, wherein the polyol comprises one or more of ethylene glycol, diethylene glycol, triethylene glycol, tetraethylene glycol, propylene glycol, dipropylene glycol, 1,3-propanediol, 1,2-butanediol, 1,3- butanediol, 1,4-butanediol, 2,3-butanediol, glycerol, trimethylolpropane, triethanolamine and trihydroxymethyl-aminomethane.

12. The process of claim 1, wherein the polyol comprises ethylene glycol.

13. The process of claim 1, wherein the substance that is capable of being adsorbed on the nanoparticles comprises one or more heteroatoms selected from O, N and S.

14. The process of claim 1, wherein the substance that is capable of being adsorbed on the nanoparticles comprises a polymer.

15. The process of claim 14, wherein the polymer comprises units of a monomer which comprises at least one heteroatom selected from O and N.

16. The process of claim 14, wherein the polymer comprises units of a monomer which comprises one or more of a hydroxy group, a carbonyl group, an ether group and an amino group.

17. The process of claim 14, wherein the polymer comprises units of a monomer which comprises at least one structural element selected from —COO—, —O—CO—O—, —CO—O—CO—, —C—O—C—, —CONR—, —NR—CO—O—, —NR$^1$—CO—NR$^2$—, —CO—NR—CO—, —SO$_2$—NR— and —SO$_2$—O—, wherein R, R$^1$ and R$^2$ each independently represent hydrogen or an organic radical.

18. The process of claim 14, wherein the polymer comprises units of vinyl pyrrolidone.

19. The process of claim 18, wherein the polymer comprises a homopolymer.

20. The process of claim 14, wherein the polymer has a weight average molecular weight of from about 1,000 to about 100,000.

21. The process of claim 1, wherein the resultant mixture has a volume of not larger than about 6 liters per mole of the metal compound.

22. The process of claim 1, wherein the resultant mixture has a volume of not larger than about 4 liters per mole of the metal compound.

23. The process of claim 1, wherein the substance that is capable of being adsorbed on the nanoparticles comprises a polymer having monomer units and a molar ratio of the monomer units and the metal compound is at least about 3:1.

24. The process of claim 23, wherein the molar ratio is at least about 10:1.

25. The process of claim 1, wherein the nanoparticle-precipitating liquid comprises a liquid that is miscible with the polyol.

26. The process of claim 1, wherein the nanoparticle-precipitating liquid is not capable of substantially dissolving the substance that is capable of being adsorbed on the nanoparticles.

27. The process of claim 1, wherein the nanoparticle-precipitating liquid comprises an aprotic solvent.

28. The process of claim 27, wherein the aprotic solvent comprises a polar solvent.

29. The process of claim 28, wherein the aprotic solvent comprises at least one of a carbonyl compound and a sulfonyl compound.

30. The process of claim 29, wherein the aprotic solvent comprises a ketone.

31. The process of claim 30, wherein the ketone comprises acetone.

32. The process of claim 1, wherein the protic solvent comprises an organic compound having at least one hydroxy group.

33. The process of claim 1, wherein the protic solvent comprises at least one of an alcohol and a polyol.

34. The process of claim 1, wherein the protic solvent comprises a glycol.

35. The process of claim 1, wherein the protic solvent comprises at least one of ethylene glycol and propylene glycol.

36. The process of claim 1, wherein the polyol and the protic solvent each comprise the same compound.

37. The process of claim 1, wherein the process further comprises a separation of precipitated nanoparticles from a liquid phase.

38. The process of claim 37, wherein the separation comprises at least one of a centrifugation, an ultrafiltration and a diafiltration.

39. The process of claim 37, wherein the process further comprises a washing of separated nanoparticles with a liquid that is a solvent for the substance that is capable of being adsorbed on the nanoparticles.

40. The process of claim 39, wherein the solvent comprises a hydroxyl-containing compound.

41. The process of claim 40, wherein the solvent comprises ethanol.

42. A process for the production of silver nanoparticles, wherein the process comprises forming the nanoparticles by combining a silver compound with a solution that comprises a glycol and a vinyl pyrrolidone polymer to form a resultant mixture, followed by cooling the resultant mixture, and thereafter precipitating formed nanoparticles by an addition to the resultant mixture of an aprotic nanoparticle-precipitating liquid in a sufficient amount to precipitate at least a substantial portion of the nanoparticles and of a protic solvent which comprises at least one of an alcohol and a polyol in a sufficient amount to improve a separation of the nanoparticles from a liquid phase.

43. The process of claim 42, wherein the silver compound comprises at least one of silver nitrate, silver acetate, silver trifluoroacetate and silver oxide.

44. The process of claim 42, wherein the glycol comprises ethylene glycol.

45. The process of claim 42, wherein the vinyl pyrrolidone polymer comprises a homopolymer.

46. The process of claim 45, wherein the homopolymer has a weight average molecular weight of from about 3,000 to about 100,000.

47. The process of claim 42, wherein the resultant mixture has a volume of not larger than about 4 liters per mole of the silver compound.

48. The process of claim 47, wherein a molar ratio of vinyl pyrrolidone units of the polymer and the silver compound is at least about 5:1.

49. The process of claim 48, wherein the molar ratio is at least about 10:1.

50. The process of claim 42, wherein the nanoparticle-precipitating liquid comprises a ketone.

51. The process of claim 50, wherein the ketone comprises acetone.

52. The process of claim 50, wherein the protic solvent comprises a glycol.

53. The process of claim 52, wherein the glycol comprises at least one of ethylene glycol and propylene glycol.

54. The process of claim 42, wherein at least a part of the protic solvent is added before the addition of the nanoparticle-precipitating liquid.

55. A method of improving the precipitation of metal nanoparticles from a mixture which comprises the nanoparticles, a polyol and a substance that is capable of being adsorbed on the nanoparticles by an addition to the mixture of a nanoparticle-precipitating liquid, wherein the method comprises cooling the mixture and, after the cooling, adding to the mixture a sufficient amount of a protic solvent to improve the separation of the nanoparticles.

56. The method of claim 55, wherein the protic solvent accelerates a settling of the nanoparticles.

57. The method of claim 56, wherein the polyol comprises a glycol having from 2 to about 4 carbon atoms.

58. The method of claim 57, wherein the glycol comprises at least one of ethylene glycol and propylene glycol.

59. The method of claim 55, wherein the protic solvent at least substantially reduces a separation of oily matter.

60. The method of claim 55, wherein the nanoparticles comprise at least one of gold, silver, copper and nickel.

61. The method of claim 55, wherein the substance that is capable of being adsorbed on the nanoparticles comprises a polymer which comprises a structural element selected from —COO—, —O—CO—O—, —CO—O—CO—, —C—O—C—, —CONR—, —NR—CO—O—, —NR$^1$—CO—NR$^2$—, —CO—NR—CO—, —SO$_2$—NR— and —SO$_2$—O—, wherein R, R$^1$ and R$^2$ each independently represent hydrogen or an organic radical.

62. The method of claim 61, wherein the polymer comprises a vinyl pyrrolidone polymer.

63. The method of claim 62, wherein a volume of the mixture is not larger than about 4 liters per mole of the metal nanoparticles.

64. The method of claim 61, wherein the polymer has a weight average molecular weight of up to about 100,000.

65. The method of claim 55, wherein a volume of the mixture is not larger than about 6 liters per mole of the metal nanoparticles.

66. The method of claim 55, wherein the substance that is capable of being adsorbed on the nanoparticles comprises a polymer having monomer units and a molar ratio of the monomer units and the metal nanoparticles is at least about 3:1.

67. The method of claim 55, wherein the nanoparticle-precipitating liquid is not capable of substantially dissolving the substance that is capable of being adsorbed on the nanoparticles.

68. The method of claim 55, wherein the nanoparticle-precipitating liquid comprises a polar aprotic solvent.

69. The method of claim 68, wherein the polar aprotic solvent comprises a ketone.

70. The method of claim 55, wherein the protic solvent comprises a hydroxyl-containing solvent.

71. The method of claim 55, wherein the protic solvent comprises at least one of an alcohol and a polyol.

* * * * *